(12) United States Patent
Tran et al.

(10) Patent No.: US 10,956,814 B2
(45) Date of Patent: Mar. 23, 2021

(54) CONFIGURABLE ANALOG NEURAL MEMORY SYSTEM FOR DEEP LEARNING NEURAL NETWORK

(71) Applicant: Silicon Storage Technology, Inc., San Jose, CA (US)

(72) Inventors: Hieu Van Tran, San Jose, CA (US); Vipin Tiwari, Dublin, CA (US); Mark Reiten, Alamo, CA (US); Nhan Do, Saratoga, CA (US)

(73) Assignee: SILICON STORAGE TECHNOLOGY, INC., San Jose, CA (US)

( * ) Notice: Subject to any disclaimer, the term of this patent is extended or adjusted under 35 U.S.C. 154(b) by 104 days.

(21) Appl. No.: 16/182,237

(22) Filed: Nov. 6, 2018

(65) Prior Publication Data
US 2020/0065660 A1 Feb. 27, 2020

Related U.S. Application Data

(60) Provisional application No. 62/723,360, filed on Aug. 27, 2018.

(51) Int. Cl.
*G06N 3/063* (2006.01)
*G06N 3/08* (2006.01)
*G06F 3/06* (2006.01)
*G06F 17/16* (2006.01)

(52) U.S. Cl.
CPC ......... *G06N 3/0635* (2013.01); *G06F 3/0688* (2013.01); *G06F 17/16* (2013.01); *G06N 3/08* (2013.01)

(58) Field of Classification Search
None
See application file for complete search history.

(56) References Cited

U.S. PATENT DOCUMENTS

| 5,029,130 A | 7/1991 | Yeh |
| 6,747,310 B2 | 6/2004 | Fan |
| 10,127,494 B1 * | 11/2018 | Cantin ................. G06N 3/0445 |
| 10,565,492 B2 | 2/2020 | Glenn et al. |

(Continued)

FOREIGN PATENT DOCUMENTS

TW 201826115 A 7/2018

OTHER PUBLICATIONS

Guo, "Mixed Signal Neurocomputing Based on Floating-gate Memories," retrieved from the Internet: url:https://www.alexandria.ucsb.edu/lib/ark:/48007/f3jhmb0, Jan. 1, 2017, pp. 1-106.

(Continued)

*Primary Examiner* — Michael D. Yaary
(74) *Attorney, Agent, or Firm* — DLA Piper LLP US

(57) ABSTRACT

Numerous embodiments are disclosed for a configurable hardware system for use in an analog neural memory system for a deep learning neural network. The components within the configurable hardware system that are configurable can include vector-by-matrix multiplication arrays, summer circuits, activation circuits, inputs, reference devices, neurons, and testing circuits. These devices can be configured to provide various layers or vector-by-matrix multiplication arrays of various sizes, such that the same hardware can be used in analog neural memory systems with different requirements.

67 Claims, 37 Drawing Sheets

(56) References Cited

U.S. PATENT DOCUMENTS

2017/0337466 A1 11/2017 Bayat et al.
2018/0157465 A1* 6/2018 Bittner .................. G06N 3/063
2019/0325289 A1* 10/2019 Cammarota ............. G06N 5/04

OTHER PUBLICATIONS

Li, et al., "Long short-term memory networks in memristor crossbars," 201 Olin Library Cornell University Itaca, NY 14853, May 30, 2018, pp. 1-26.
Kucic, "Analog Computing Arrays," retrieve from the Internet: url:http://hdl.handle.net/1853/4878, Mar. 1, 2005, p. 76.

* cited by examiner

US 10,956,814 B2

CONFIGURABLE ANALOG NEURAL MEMORY SYSTEM FOR DEEP LEARNING NEURAL NETWORK

PRIORITY CLAIM

This application claims priority to U.S. Provisional Patent Application No. 62/723,360, filed on Aug. 27, 2018, and titled, "Configurable Analog Neural Memory System for Deep Learning Neural Network," which is incorporated by reference herein.

FIELD OF THE INVENTION

Numerous embodiments are disclosed for a configurable hardware system for use in an analog neural memory system for a deep learning neural network.

BACKGROUND OF THE INVENTION

Artificial neural networks mimic biological neural networks (the central nervous systems of animals, in particular the brain) and are used to estimate or approximate functions that can depend on a large number of inputs and are generally unknown. Artificial neural networks generally include layers of interconnected "neurons" which exchange messages between each other.

FIG. 1 illustrates an artificial neural network, where the circles represent the inputs or layers of neurons. The connections (called synapses) are represented by arrows, and have numeric weights that can be tuned based on experience. This makes neural networks adaptive to inputs and capable of learning. Typically, neural networks include a layer of multiple inputs. There are typically one or more intermediate layers of neurons, and an output layer of neurons that provide the output of the neural network. The neurons at each level individually or collectively make a decision based on the received data from the synapses.

One of the major challenges in the development of artificial neural networks for high-performance information processing is a lack of adequate hardware technology. Indeed, practical neural networks rely on a very large number of synapses, enabling high connectivity between neurons, i.e. a very high computational parallelism. In principle, such complexity can be achieved with digital supercomputers or specialized graphics processing unit clusters. However, in addition to high cost, these approaches also suffer from mediocre energy efficiency as compared to biological networks, which consume much less energy primarily because they perform low-precision analog computation. CMOS analog circuits have been used for artificial neural networks, but most CMOS-implemented synapses have been too bulky given the high number of neurons and synapses.

Applicant previously disclosed an artificial (analog) neural network that utilizes one or more non-volatile memory arrays as the synapses in U.S. patent application Ser. No. 15/594,439, which is incorporated by reference. The non-volatile memory arrays operate as an analog neuromorphic memory. The neural network device includes a first plurality of synapses configured to receive a first plurality of inputs and to generate therefrom a first plurality of outputs, and a first plurality of neurons configured to receive the first plurality of outputs. The first plurality of synapses includes a plurality of memory cells, wherein each of the memory cells includes spaced apart source and drain regions formed in a semiconductor substrate with a channel region extending there between, a floating gate disposed over and insulated from a first portion of the channel region and a non-floating gate disposed over and insulated from a second portion of the channel region. Each of the plurality of memory cells is configured to store a weight value corresponding to a number of electrons on the floating gate. The plurality of memory cells is configured to multiply the first plurality of inputs by the stored weight values to generate the first plurality of outputs.

Each non-volatile memory cells used in the analog neuromorphic memory system must be erased and programmed to hold a very specific and precise amount of charge, i.e., the number of electrons, in the floating gate. For example, each floating gate must hold one of N different values, where N is the number of different weights that can be indicated by each cell. Examples of N include 16, 32, 64, 128, and 256.

One challenge of implementing analog neuro memory systems is that various layers containing arrays of different sizes are required. Arrays of different sizes have different needs for supporting circuitry outside of the array. Providing customized hardware for each system can become costly and time-consuming.

What is needed is a configurable architecture for an analog neuro memory system that can provide various layers of vector-by-matrix multiplication arrays of various sizes, along with supporting circuitry of the right size, such that the same hardware can be used in analog neural memory systems with different requirements.

SUMMARY OF THE INVENTION

Numerous embodiments are disclosed for a configurable hardware system for use in an analog neural memory system for a deep learning neural network. The components within the configurable hardware system that are configurable can include vector-by-matrix multiplication arrays, summer circuits, activation circuits, inputs, reference devices, neurons, and testing circuits. These devices can be configured to provide various layers or vector-by-matrix multiplication arrays of various sizes, such that the same hardware can be used in analog neural memory systems with different requirements.

DETAILED DESCRIPTION OF THE INVENTION

The artificial neural networks of the present invention utilize a combination of CMOS technology and non-volatile memory arrays.

Non-Volatile Memory Cells

Figure 1:
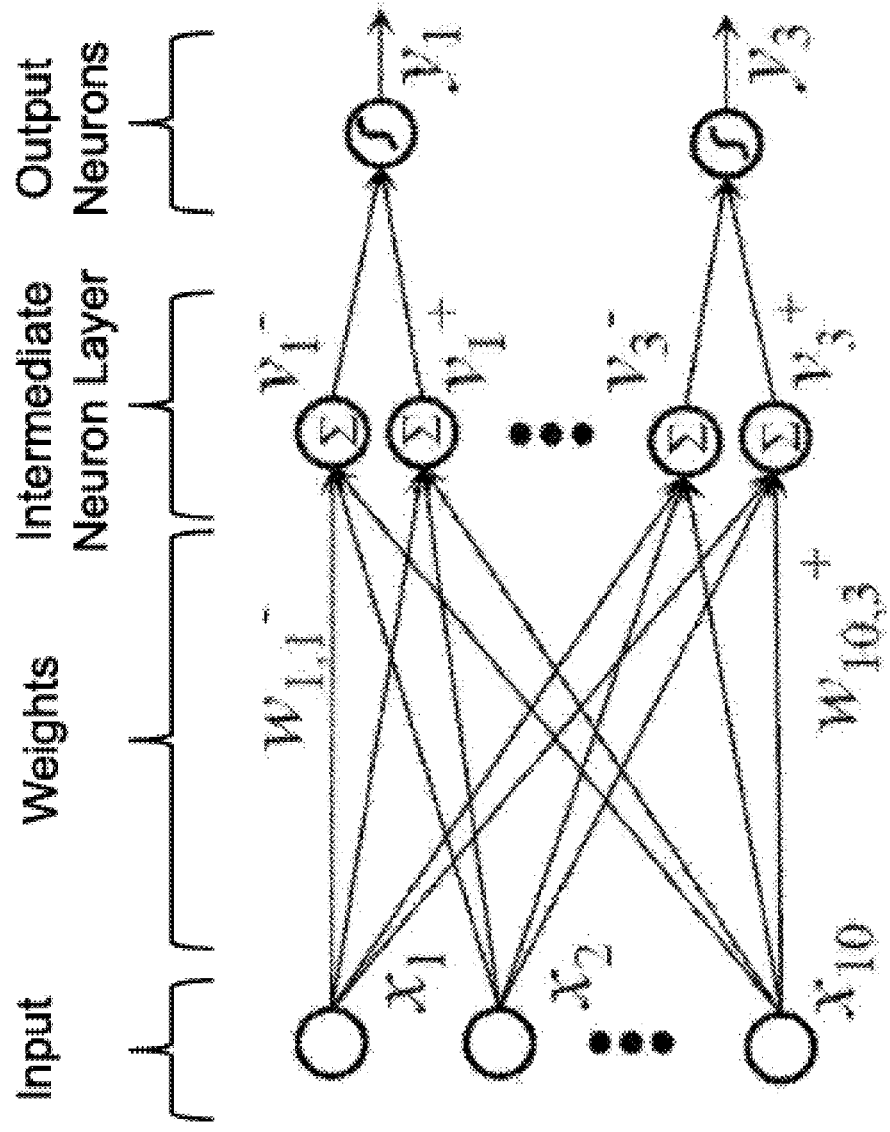
FIG. 1 is a diagram that illustrates a prior art artificial neural network.
Figure 2:
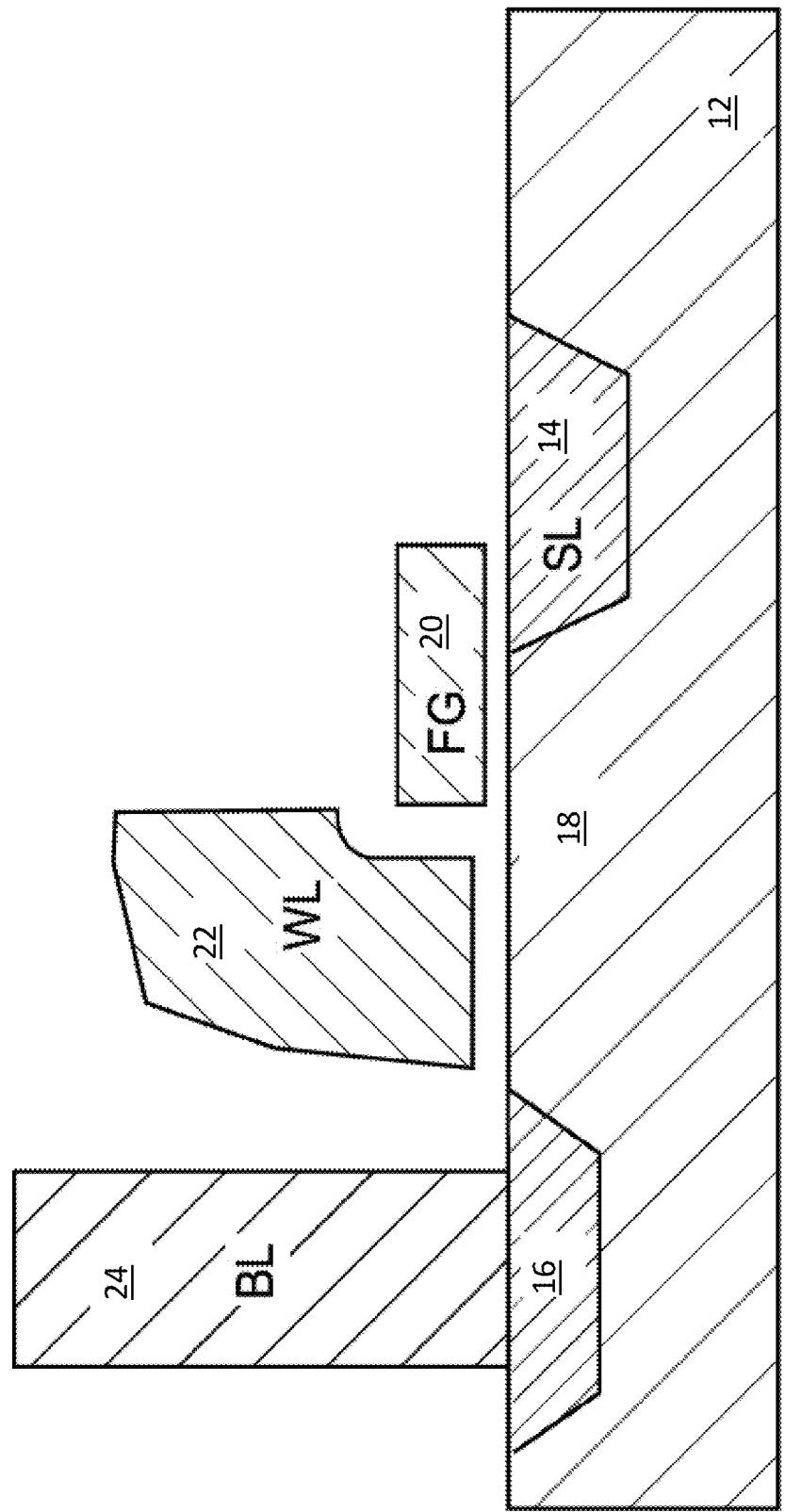
FIG. 2 is a cross-sectional side view of a conventional 2-gate non-volatile memory cell.

Digital non-volatile memories are well known. For example, U.S. Pat. No. 5,029,130 ("the '130 patent"), which is incorporated herein by reference, discloses an array of split gate non-volatile memory cells, which are a type of flash memory cells, and is incorporated herein by reference for all purposes. Such a memory cell 210 is shown in FIG. 2. Each memory cell 210 includes source region 14 and drain region 16 formed in a semiconductor substrate 12, with a channel region 18 there between. A floating gate 20 is formed over and insulated from (and controls the conductivity of) a first portion of the channel region 18, and over a portion of the source region 14. A word line terminal 22 (which is typically coupled to a word line) has a first portion that is disposed over and insulated from (and controls the conductivity of) a second portion of the channel region 18, and a second portion that extends up and over the floating gate 20. The floating gate 20 and word line terminal 22 are insulated from the substrate 12 by a gate oxide. Bitline 24 is coupled to drain region 16.

Memory cell 210 is erased (where electrons are removed from the floating gate) by placing a high positive voltage on the word line terminal 22, which causes electrons on the floating gate 20 to tunnel through the intermediate insulation from the floating gate 20 to the word line terminal 22 via Fowler-Nordheim tunneling.

Memory cell 210 is programmed (where electrons are placed on the floating gate) by placing a positive voltage on the word line terminal 22, and a positive voltage on the source region 14. Electron current will flow from the source region 14 towards the drain region 16. The electrons will accelerate and become heated when they reach the gap between the word line terminal 22 and the floating gate 20. Some of the heated electrons will be injected through the gate oxide onto the floating gate 20 due to the attractive electrostatic force from the floating gate 20.

Memory cell 210 is read by placing positive read voltages on the drain region 16 and word line terminal 22 (which turns on the portion of the channel region 18 under the word line terminal). If the floating gate 20 is positively charged (i.e. erased of electrons), then the portion of the channel region 18 under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Table No. 1 depicts typical voltage ranges that can be applied to the terminals of memory cell 110 for performing read, erase, and program operations:

TABLE No. 1

Figure 3:
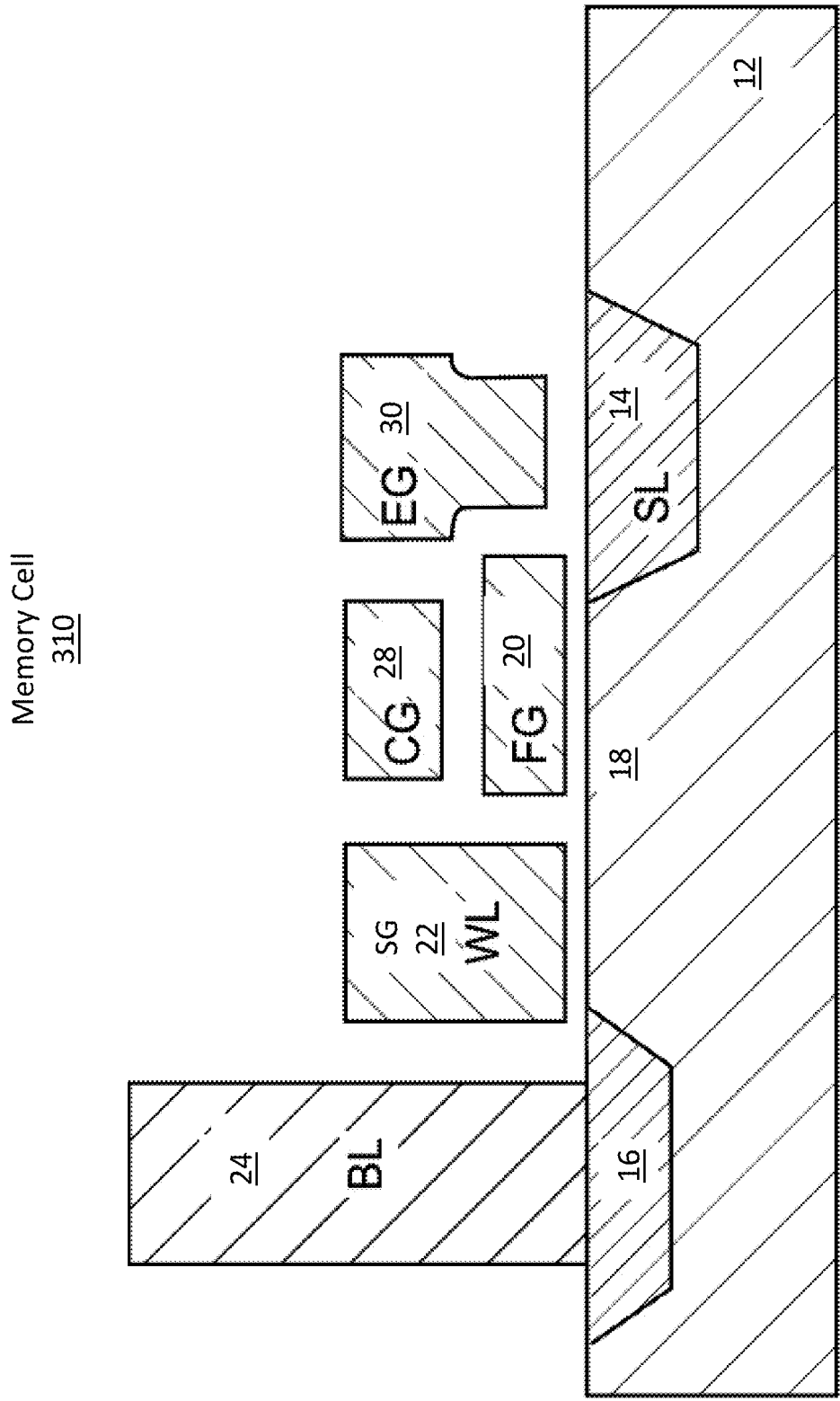
FIG. 3 is a cross-sectional side view of a conventional 4-gate non-volatile memory cell.

Operation of Flash Memory Cell 210 of FIG. 3

|  | WL | BL | SL |
|---|---|---|---|
| Read | 2-3 V | 0.6-2 V | 0 V |
| Erase | ~11-13 V | 0 V | 0 V |
| Program | 1-2 V | 1-3 µA | 9-10 V |

Other split gate memory cell configurations, which are other types of flash memory cells, are known. For example, FIG. 3 depicts a four-gate memory cell 310 comprising source region 14, drain region 16, floating gate 20 over a first portion of channel region 18, a select gate 22 (typically coupled to a word line, WL) over a second portion of the channel region 18, a control gate 28 over the floating gate 20, and an erase gate 30 over the source region 14. This configuration is described in U.S. Pat. No. 6,747,310, which is incorporated herein by reference for all purposes). Here, all gates are non-floating gates except floating gate 20, meaning that they are electrically connected or connectable to a voltage source. Programming is performed by heated electrons from the channel region 18 injecting themselves onto the floating gate 20. Erasing is performed by electrons tunneling from the floating gate 20 to the erase gate 30.

Table No. 2 depicts typical voltage ranges that can be applied to the terminals of memory cell 310 for performing read, erase, and program operations:

TABLE No. 2

| Operation of Flash Memory Cell 310 of FIG. 3 | | | | | |
| --- | --- | --- | --- | --- | --- |
| | WL/SG | BL | CG | EG | SL |
| Read | 1.0-2 V | 0.6-2 V | 0-2.6 V | 0-2.6 V | 0 V |
| Erase | −0.5 V/0 V | 0 V | 0 V/−8 V | 8-12 V | 0 V |
| Program | 1 V | 1 µA | 8-11 V | 4.5-9 V | 4.5-5 V |

Figure 4:
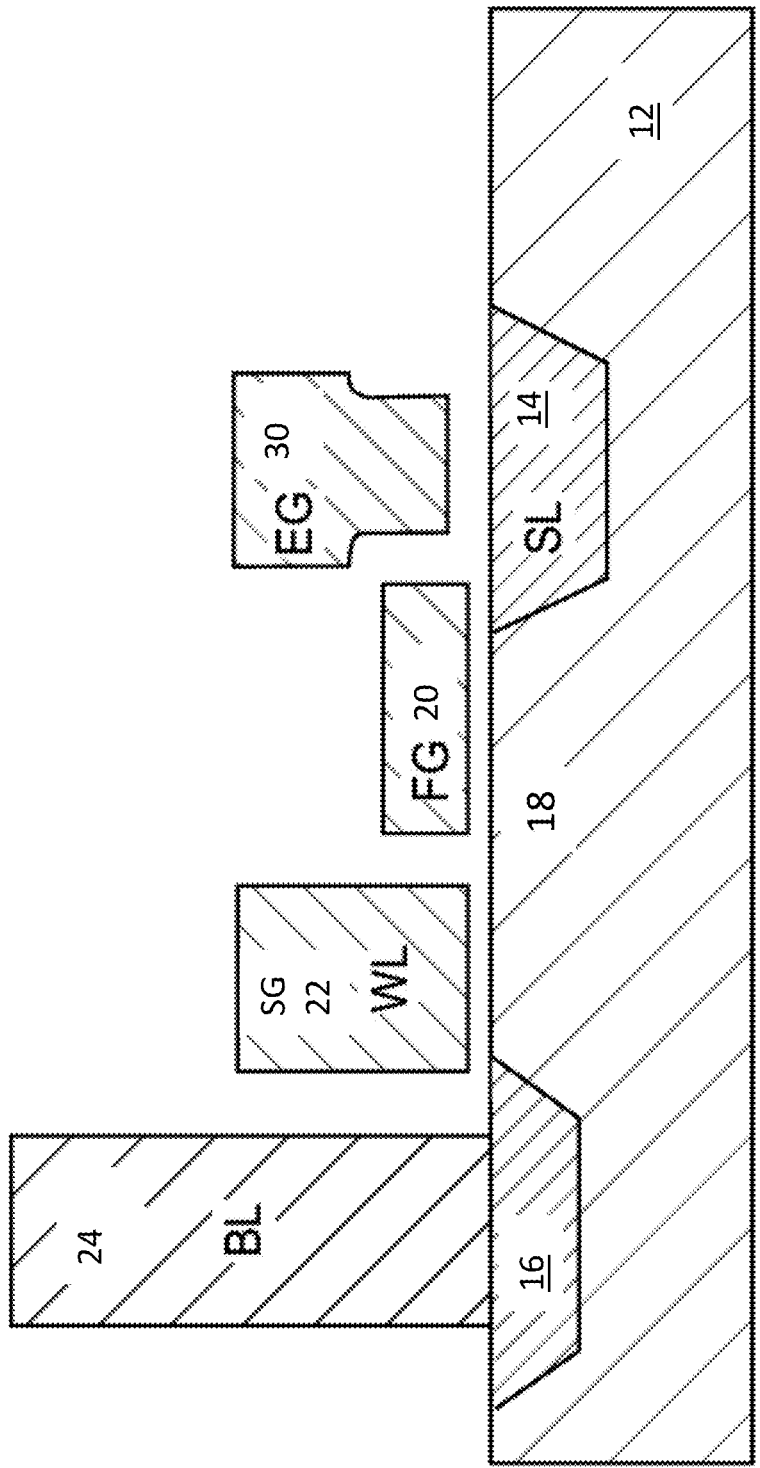
FIG. 4 is a side cross-sectional side view of conventional 3-gate non-volatile memory cell.

FIG. 4 depicts a three-gate memory cell 410, which is another type of flash memory cell. Memory cell 410 is identical to the memory cell 310 of FIG. 3 except that memory cell 410 does not have a separate control gate. The erase operation (whereby erasing occurs through use of the erase gate) and read operation are similar to that of the FIG. 3 except there is no control gate bias applied. The programming operation also is done without the control gate bias, and as a result, a higher voltage must be applied on the source line during a program operation to compensate for a lack of control gate bias.

Table No. 3 depicts typical voltage ranges that can be applied to the terminals of memory cell 410 for performing read, erase, and program operations:

TABLE No. 3

| Operation of Flash Memory Cell 410 of FIG. 4 | | | | |
| --- | --- | --- | --- | --- |
| | WL/SG | BL | EG | SL |
| Read | 0.7-2.2 V | 0.6-2 V | 0-2.6 V | 0 V |
| Erase | −0.5 V/0 V | 0 V | 11.5 V | 0 V |
| Program | 1 V | 2-3 µA | 4.5 V | 7-9 V |

Figure 5:
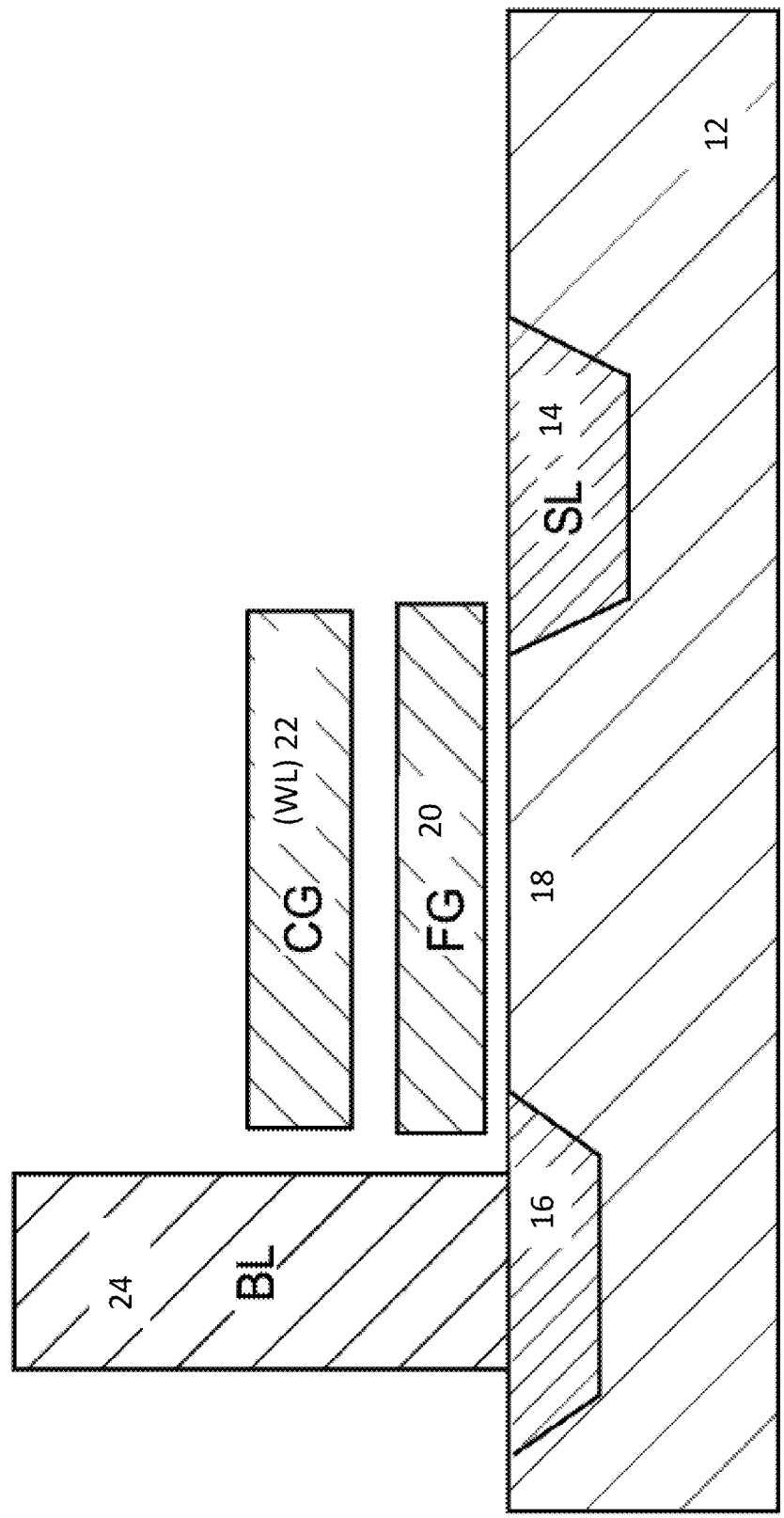
FIG. 5 is a cross-sectional side view of another conventional 2-gate non-volatile memory cell.

FIG. 5 depicts stacked gate memory cell 510, which is another type of flash memory cell. Memory cell 510 is similar to memory cell 210 of FIG. 2, except that floating gate 20 extends over the entire channel region 18, and control gate 22 (which here will be coupled to a word line) extends over floating gate 20, separated by an insulating layer (not shown). The erase, programming, and read operations operate in a similar manner to that described previously for memory cell 210.

Table No. 4 depicts typical voltage ranges that can be applied to the terminals of memory cell 510 and substrate 12 for performing read, erase, and program operations:

TABLE No. 4

| Operation of Flash Memory Cell 510 of FIG. 5 | | | | |
| --- | --- | --- | --- | --- |
| | CG | BL | SL | Substrate |
| Read | 2-5 V | 0.6-2 V | 0 V | 0 V |
| Erase | −8 to −10 V/0 V | FLT | FLT | 8-10 V/15-20 V |
| Program | 8-12 V | 3-5 V | 0 V | 0 V |

In order to utilize the memory arrays comprising one of the types of non-volatile memory cells described above in an artificial neural network, two modifications are made. First, the lines are configured so that each memory cell can be individually programmed, erased, and read without adversely affecting the memory state of other memory cells in the array, as further explained below. Second, continuous (analog) programming of the memory cells is provided.

Specifically, the memory state (i.e. charge on the floating gate) of each memory cell in the array can be continuously changed from a fully erased state to a fully programmed state, independently and with minimal disturbance of other memory cells. In another embodiment, the memory state (i.e., charge on the floating gate) of each memory cell in the array can be continuously changed from a fully programmed state to a fully erased state, and vice-versa, independently and with minimal disturbance of other memory cells. This means the cell storage is analog or at the very least can store one of many discrete values (such as 16 or 64 different values), which allows for very precise and individual tuning of all the cells in the memory array, and which makes the memory array ideal for storing and making fine tuning adjustments to the synapsis weights of the neural network.

Neural Networks Employing Non-Volatile Memory Cell Arrays

Figure 6:
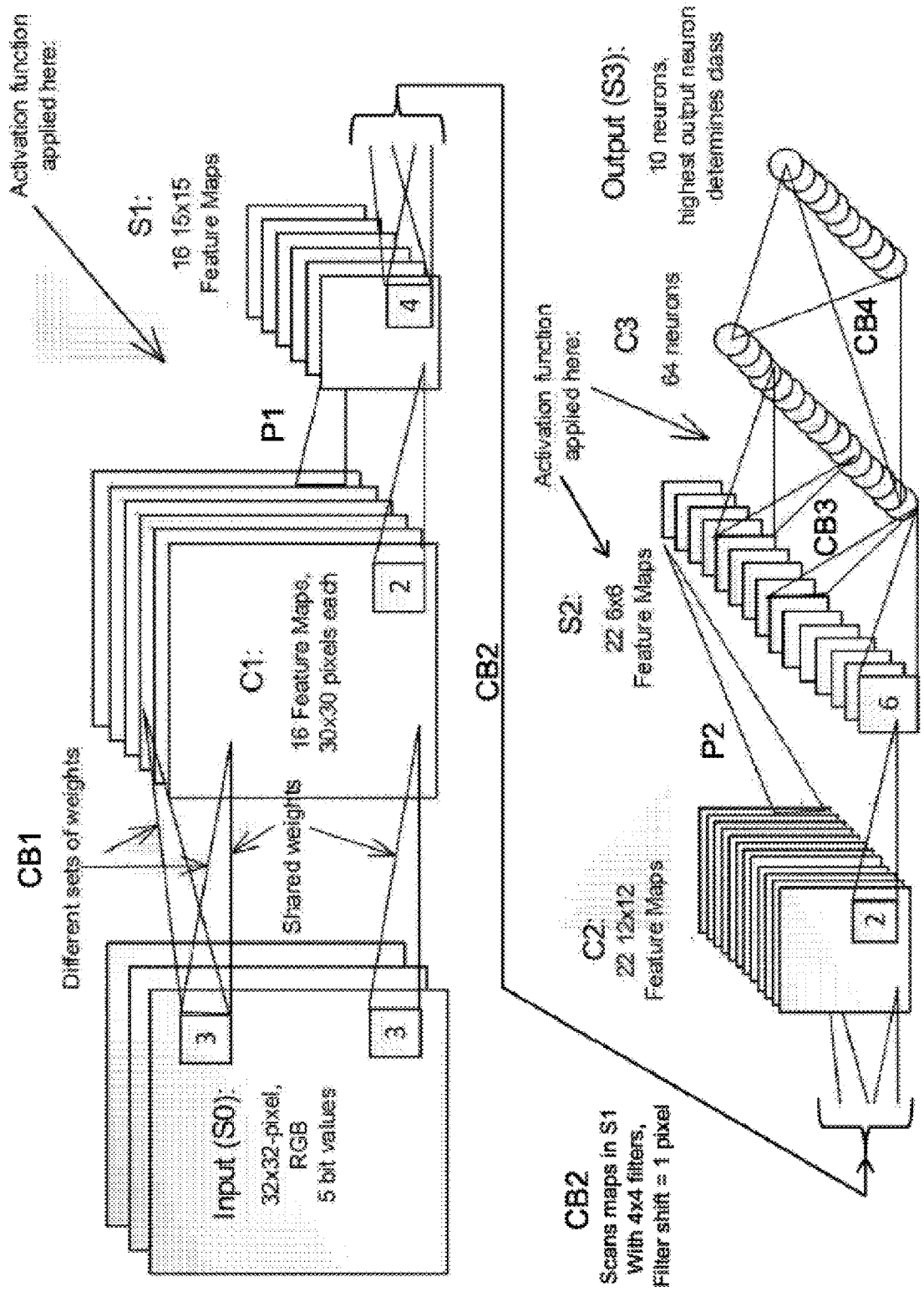
FIG. 6 is a diagram illustrating the different levels of an exemplary artificial neural network utilizing a non-volatile memory array.

FIG. 6 conceptually illustrates a non-limiting example of a neural network utilizing a non-volatile memory array of the present embodiments. This example uses the non-volatile memory array neural network for a facial recognition application, but any other appropriate application could be implemented using a non-volatile memory array based neural network.

S0 is the input layer, which for this example is a 32×32 pixel RGB image with 5 bit precision (i.e. three 32×32 pixel arrays, one for each color R, G and B, each pixel being 5 bit precision). The synapses CB1 going from input layer S0 to layer C1 apply different sets of weights in some instances and shared weights in other instances, and scan the input image with 3×3 pixel overlapping filters (kernel), shifting the filter by 1 pixel (or more than 1 pixel as dictated by the model). Specifically, values for 9 pixels in a 3×3 portion of the image (i.e., referred to as a filter or kernel) are provided to the synapses CB1, where these 9 input values are multiplied by the appropriate weights and, after summing the outputs of that multiplication, a single output value is determined and provided by a first synapse of CB1 for generating a pixel of one of the layers of feature map C1. The 3×3 filter is then shifted one pixel to the right within input layer S0 (i.e., adding the column of three pixels on the right, and dropping the column of three pixels on the left), whereby the 9 pixel values in this newly positioned filter are provided to the synapses CB1, where they are multiplied by the same weights and a second single output value is determined by the associated synapse. This process is continued until the 3×3 filter scans across the entire 32×32 pixel image of input layer S0, for all three colors and for all bits (precision values). The process is then repeated using different sets of weights to generate a different feature map of C1, until all the features maps of layer C1 have been calculated.

In layer C1, in the present example, there are 16 feature maps, with 30×30 pixels each. Each pixel is a new feature pixel extracted from multiplying the inputs and kernel, and therefore each feature map is a two dimensional array, and thus in this example layer C1 constitutes 16 layers of two dimensional arrays (keeping in mind that the layers and arrays referenced herein are logical relationships, not necessarily physical relationships—i.e., the arrays are not necessarily oriented in physical two dimensional arrays). Each of the 16 feature maps in layer C1 is generated by one of sixteen different sets of synapse weights applied to the filter scans. The C1 feature maps could all be directed to different aspects of the same image feature, such as boundary identification. For example, the first map (generated using a first weight set, shared for all scans used to generate this first map) could identify circular edges, the second map (generated using a second weight set different from the first weight set) could identify rectangular edges, or the aspect ratio of certain features, and so on.

An activation function P1 (pooling) is applied before going from layer C1 to layer S1, which pools values from consecutive, non-overlapping 2×2 regions in each feature map. The purpose of the pooling function is to average out the nearby location (or a max function can also be used), to reduce the dependence of the edge location for example and to reduce the data size before going to the next stage. At layer S1, there are 16 15×15 feature maps (i.e., sixteen different arrays of 15×15 pixels each). The synapses CB2 going from layer S1 to layer C2 scan maps in S1 with 4×4 filters, with a filter shift of 1 pixel. At layer C2, there are 22 12×12 feature maps. An activation function P2 (pooling) is applied before going from layer C2 to layer S2, which pools values from consecutive non-overlapping 2×2 regions in each feature map. At layer S2, there are 22 6×6 feature maps. An activation function (pooling) is applied at the synapses CB3 going from layer S2 to layer C3, where every neuron in layer C3 connects to every map in layer S2 via a respective synapse of CB3. At layer C3, there are 64 neurons. The synapses CB4 going from layer C3 to the output layer S3 fully connects C3 to S3, i.e. every neuron in layer C3 is connected to every neuron in layer S3. The output at S3 includes 10 neurons, where the highest output neuron determines the class. This output could, for example, be indicative of an identification or classification of the contents of the original image.

Each layer of synapses is implemented using an array, or a portion of an array, of non-volatile memory cells.

Figure 7:
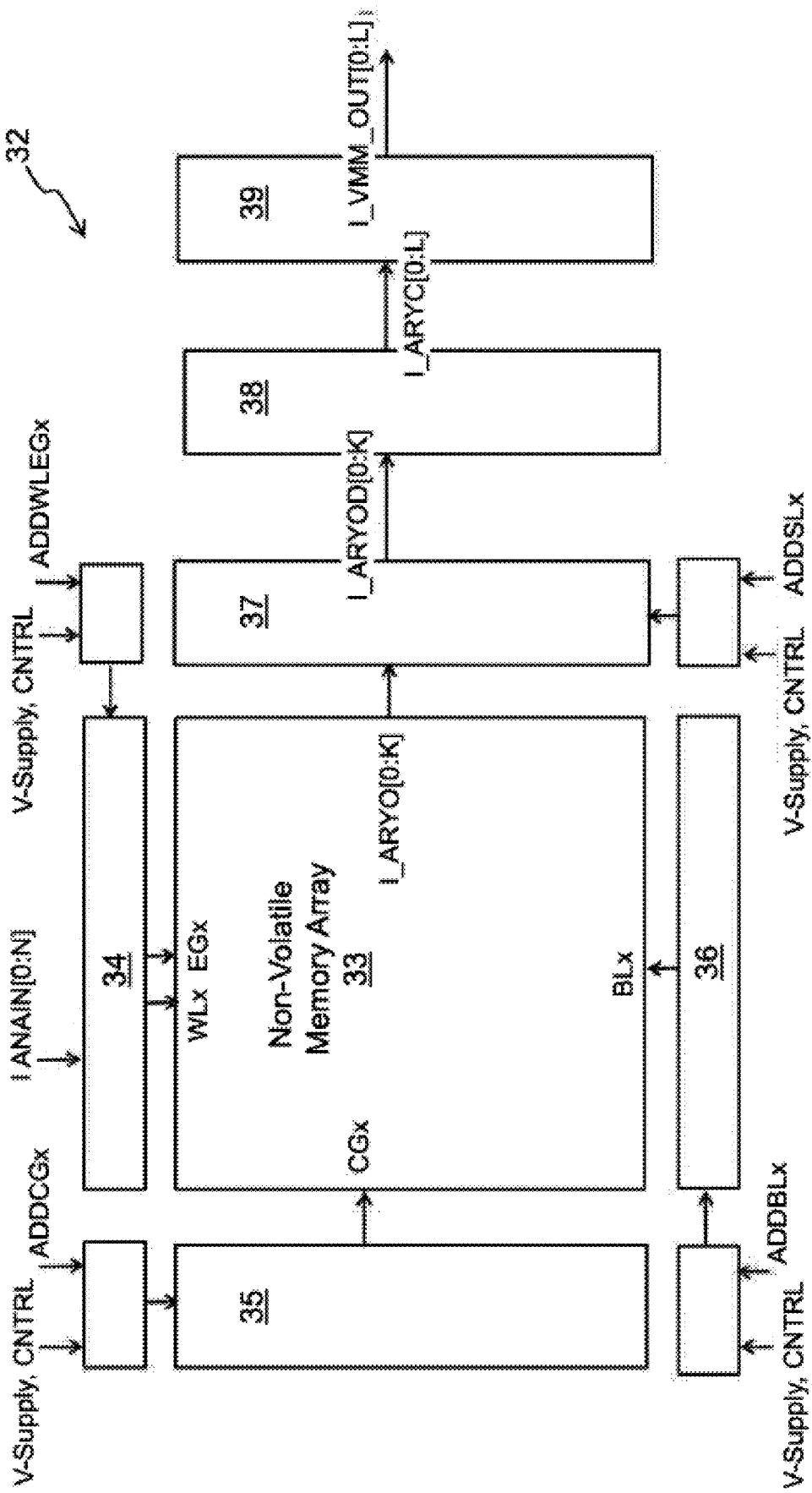
FIG. 7 is a block diagram illustrating a vector multiplier matrix.

FIG. 7 is a block diagram of an array that can be used for that purpose. Vector-by-matrix multiplication (VMM) array 32 includes non-volatile memory cells and is utilized as the synapses (such as CB1, CB2, CB3, and CB4 in FIG. 6) between one layer and the next layer. Specifically, VMM array 32 includes an array of non-volatile memory cells 33, erase gate and word line gate decoder 34, control gate decoder 35, bit line decoder 36 and source line decoder 37, which decode the respective inputs for the non-volatile memory cell array 33. Input to VMM array 32 can be from the erase gate and wordline gate decoder 34 or from the control gate decoder 35. Source line decoder 37 in this example also decodes the output of the non-volatile memory cell array 33. Alternatively, bit line decoder 36 can decode the output of the non-volatile memory cell array 33.

Non-volatile memory cell array 33 serves two purposes. First, it stores the weights that will be used by the VMM array 32. Second, the non-volatile memory cell array 33 effectively multiplies the inputs by the weights stored in the non-volatile memory cell array 33 and adds them up per output line (source line or bit line) to produce the output, which will be the input to the next layer or input to the final layer. By performing the multiplication and addition function, the non-volatile memory cell array 33 negates the need for separate multiplication and addition logic circuits and is also power efficient due to its in-situ memory computation.

The output of non-volatile memory cell array 33 is supplied to a differential summer (such as a summing op-amp or a summing current mirror) 38, which sums up the outputs of the non-volatile memory cell array 33 to create a single value for that convolution. The differential summer 38 is arranged to perform summation of positive weight and negative weight.

The summed up output values of differential summer 38 are then supplied to an activation function circuit 39, which rectifies the output. The activation function circuit 39 may provide sigmoid, tan h, or ReLU functions. The rectified output values of activation function circuit 39 become an element of a feature map as the next layer (e.g. C1 in FIG. 6), and are then applied to the next synapse to produce the next feature map layer or final layer. Therefore, in this example, non-volatile memory cell array 33 constitutes a plurality of synapses (which receive their inputs from the prior layer of neurons or from an input layer such as an image database), and summing op-amp 38 and activation function circuit 39 constitute a plurality of neurons.

The input to VMM array 32 in FIG. 7 (WLx, EGx, CGx, and optionally BLx and SLx) can be analog level, binary level, or digital bits (in which case a DAC is provided to convert digital bits to appropriate input analog level) and the output can be analog level, binary level, or digital bits (in which case an output ADC is provided to convert output analog level into digital bits).

Figure 8:
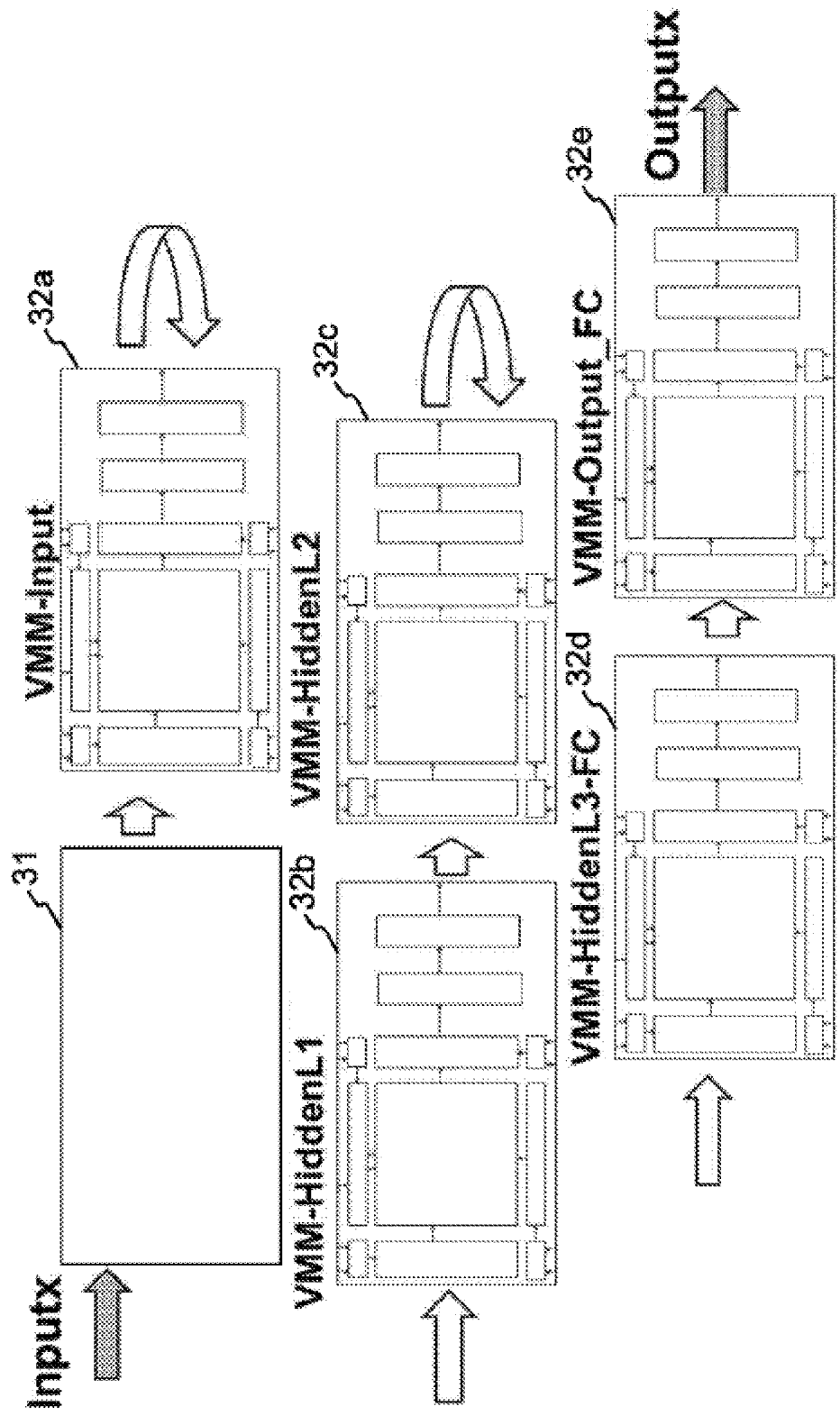
FIG. 8 is a block diagram illustrating various levels of a vector multiplier matrix.

FIG. 8 is a block diagram depicting the usage of numerous layers of VMM arrays 32, here labeled as VMM arrays 32a, 32b, 32c, 32d, and 32e. As shown in FIG. 8, the input, denoted Inputx, is converted from digital to analog by a digital-to-analog converter 31, and provided to input VMM array 32a. The converted analog inputs could be voltage or current. The input D/A conversion for the first layer could be done by using a function or a LUT (look up table) that maps the inputs Inputx to appropriate analog levels for the matrix multiplier of input VMM array 32a. The input conversion could also be done by an analog to analog (A/A) converter to convert an external analog input to a mapped analog input to the input VMM array 32a.

The output generated by input VMM array 32a is provided as an input to the next VMM array (hidden level 1) 32b, which in turn generates an output that is provided as an input to the next VMM array (hidden level 2) 32c, and so on. The various layers of VMM array 32 function as different layers of synapses and neurons of a convolutional neural network (CNN). Each VMM array 32a, 32b, 32c, 32d, and 32e can be a stand-alone, physical non-volatile memory array, or multiple VMM arrays could utilize different portions of the same physical non-volatile memory array, or multiple VMM arrays could utilize overlapping portions of the same physical non-volatile memory array. The example shown in FIG. 8 contains five layers (32a,32b,32c,32d,32e): one input layer (32a), two hidden layers (32b,32c), and two fully connected layers (32d,32e). One of ordinary skill in the art will appreciate that this is merely exemplary and that a system instead could comprise more than two hidden layers and more than two fully connected layers.

Vector-By-Matrix Multiplication (VMM) Arrays

Figure 9:
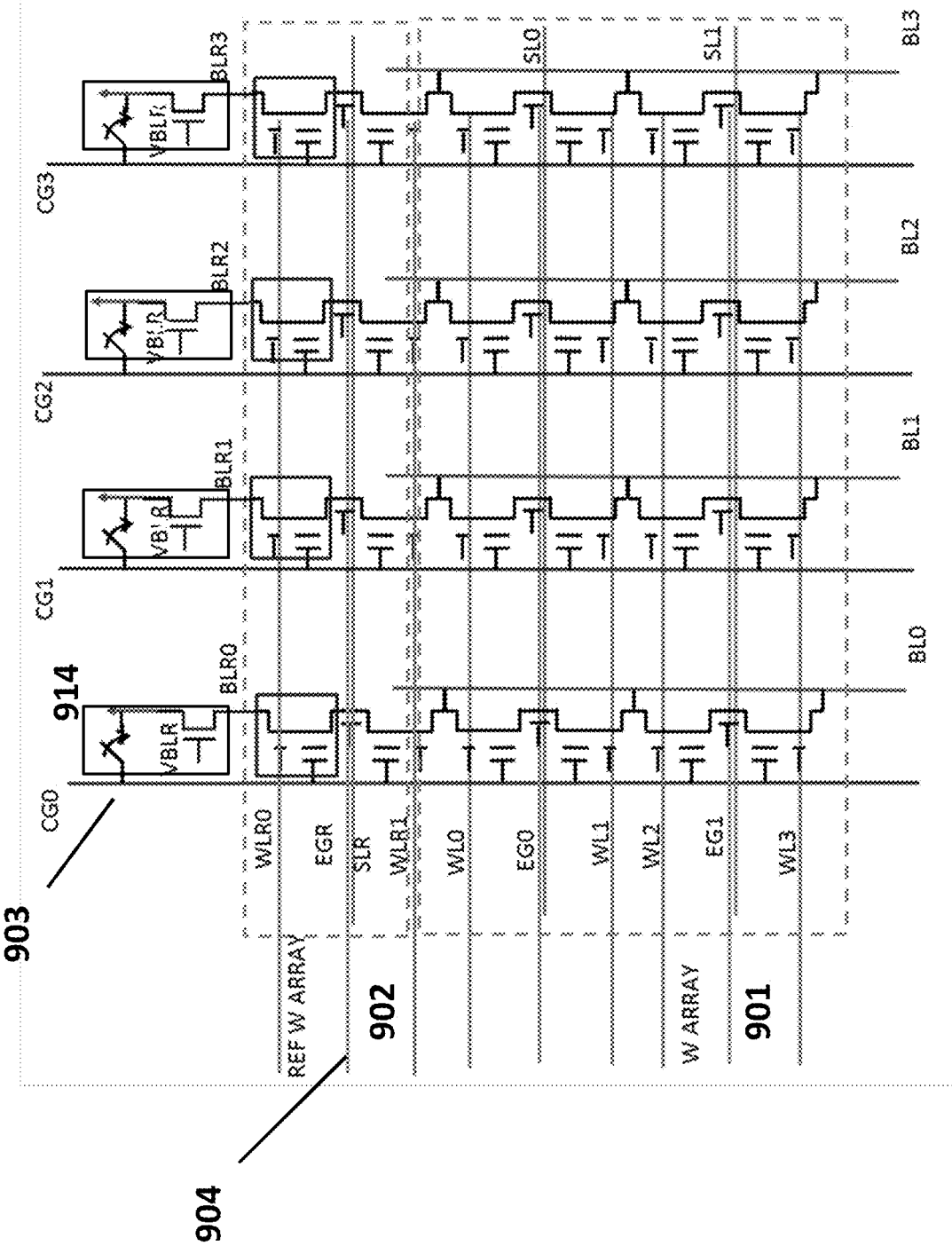
FIG. 9 depicts another embodiment of a vector multiplier matrix.

FIG. 9 depicts neuron VMM array 900, which is particularly suited for memory cells 310 as shown in FIG. 3, and is utilized as the synapses and parts of neurons between an input layer and the next layer. VMM array 900 comprises memory array 901 of non-volatile memory cells and reference array 902 (at the top of the array) of non-volatile reference memory cells. Alternatively, another reference array can be placed at the bottom.

In VMM array 900, control gate lines, such as control gate line 903, run in a vertical direction (hence reference array 902 in the row direction is orthogonal to control gate line 903), and erase gate lines, such as erase gate line 904, run in a horizontal direction. Here, the inputs to VMM array 900 are provided on the control gate lines (CG0, CG1, CG2, CG3), and the output of VMM array 900 emerges on the source lines (SL0, SL1). In one embodiment, only even rows are used, and in another embodiment, only odd rows are used. The current placed on each source line (SL0, SL1, respectively) performs a summing function of all the currents from the memory cells connected to that particular source line.

As described herein for neural networks, the non-volatile memory cells of VMM array 900, i.e. the flash memory of VMM array 900, are preferably configured to operate in a sub-threshold region.

The non-volatile reference memory cells and the non-volatile memory cells described herein are biased in weak inversion:

$$Ids = Io * e^{(Vg-Vth)/kVt} = w*Io*e^{(Vg)/kVt},$$

where $w = e^{(-Vth)/kVt}$

For an I-to-V log converter using a memory cell (such as a reference memory cell or a peripheral memory cell) or a transistor to convert input current into an input voltage:

$$Vg = k*Vt*\log[Ids/wp*Io]$$

Here, wp is w of a reference or peripheral memory cell.

For a memory array used as a vector matrix multiplier VMM array, the output current is:

$$Iout = wa*Io*e^{(Vg)/kVt}, \text{ namely}$$

$$Iout = (wa/wp)*Iin = W*Iin$$

$$W = e^{(Vthp-Vtha)/kVt}$$

Here, wa=w of each memory cell in the memory array.

A wordline or control gate can be used as the input for the memory cell for the input voltage.

Alternatively, the flash memory cells of VMM arrays described herein can be configured to operate in the linear region:

$$Ids = \text{beta}*(Vgs-Vth)*Vds; \text{beta} = u*Cox*W/L$$

$$W \alpha (Vgs-Vth)$$

A wordline or control gate or bitline or sourceline can be used as the input for the memory cell operated in the linear region for the input voltage.

For an I-to-V linear converter, a memory cell (such as a reference memory cell or a peripheral memory cell) or a transistor operating in the linear region can be used to linearly convert an input/output current into an input/output voltage.

Other embodiments for VMM array 32 of FIG. 7 are described in U.S. patent application Ser. No. 15/826,345, which is incorporated by reference herein. As described in that application. a sourceline or a bitline can be used as the neuron output (current summation output).

Figure 10:
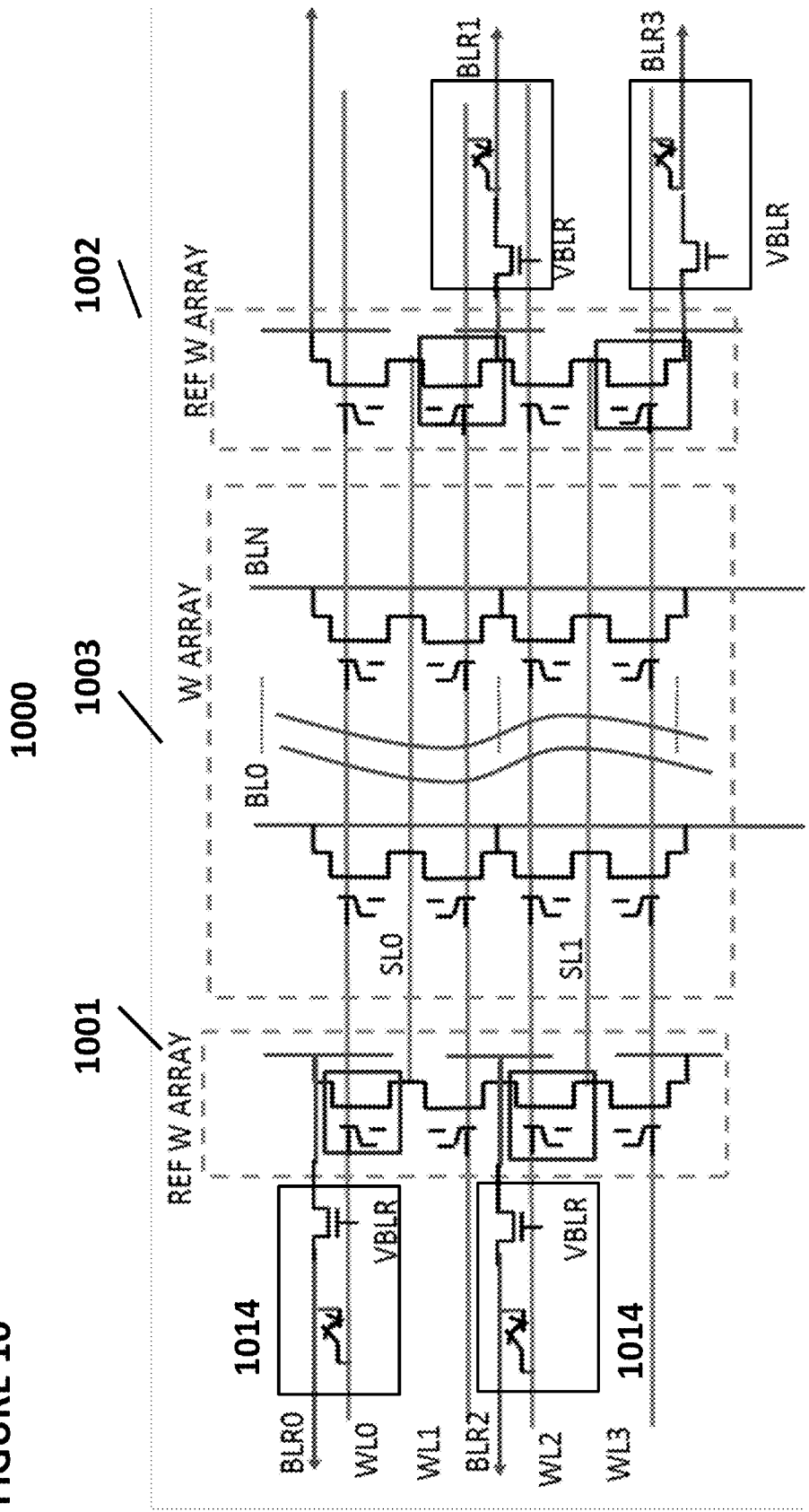
FIG. 10 depicts another embodiment of a vector multiplier matrix.

FIG. 10 depicts neuron VMM array 1000, which is particularly suited for memory cells 210 as shown in FIG. 2, and is utilized as the synapses between an input layer and the next layer. VMM array 1000 comprises a memory array 1003 of non-volatile memory cells, reference array 1001 of first non-volatile reference memory cells, and reference array 1002 of second non-volatile reference memory cells. Reference arrays 1001 and 1002, arranged in the column direction of the array, serve to convert current inputs flowing into terminals BLR0, BLR1, BLR2, and BLR3 into voltage inputs WL0, WL1, WL2, and WL3. In effect, the first and second non-volatile reference memory cells are diode-connected through multiplexors 1014 with current inputs flowing into them. The reference cells are tuned (e.g., programmed) to target reference levels. The target reference levels are provided by a reference mini-array matrix (not shown).

Memory array 1003 serves two purposes. First, it stores the weights that will be used by the VMM array 1000 on respective memory cells thereof. Second, memory array 1003 effectively multiplies the inputs (i.e. current inputs provided in terminals BLR0, BLR1, BLR2, and BLR3, which reference arrays 1001 and 1002 convert into the input voltages to supply to wordlines WL0, WL1, WL2, and WL3) by the weights stored in the memory array 1003 and then adds all the results (memory cell currents) to produce the output on the respective bit lines (BL0-BLN), which will be the input to the next layer or input to the final layer. By performing the multiplication and addition function, memory array 1003 negates the need for separate multiplication and addition logic circuits and is also power efficient. Here, the voltage inputs are provided on the word lines WL0, WL1, WL2, and WL3, and the output emerges on the respective bit lines BL0-BLN during a read (inference) operation. The current placed on each of the bit lines BL0-BLN performs a summing function of the currents from all non-volatile memory cells connected to that particular bitline.

Table No. 5 depicts operating voltages for VMM array 1000. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 5

| | Operation of VMM Array 1000 of FIG. 10: | | | | | |
|---|---|---|---|---|---|---|
| | WL | WL-unsel | BL | BL-unsel | SL | SL-unsel |
| Read | 1-3.5 V | −0.5 V/0 V | 0.6-2 V (Ineuron) | 0.6 V-2 V/0 V | 0 V | 0 V |
| Erase | ~5-13 V | 0 V | 0 V | 0 V | 0 V | 0 V |
| Program | 1-2 V | −0.5 V/0 V | 0.1-3 uA | Vinh ~2.5 V | 4-10 V | 0-1 V/FLT |

Figure 11:
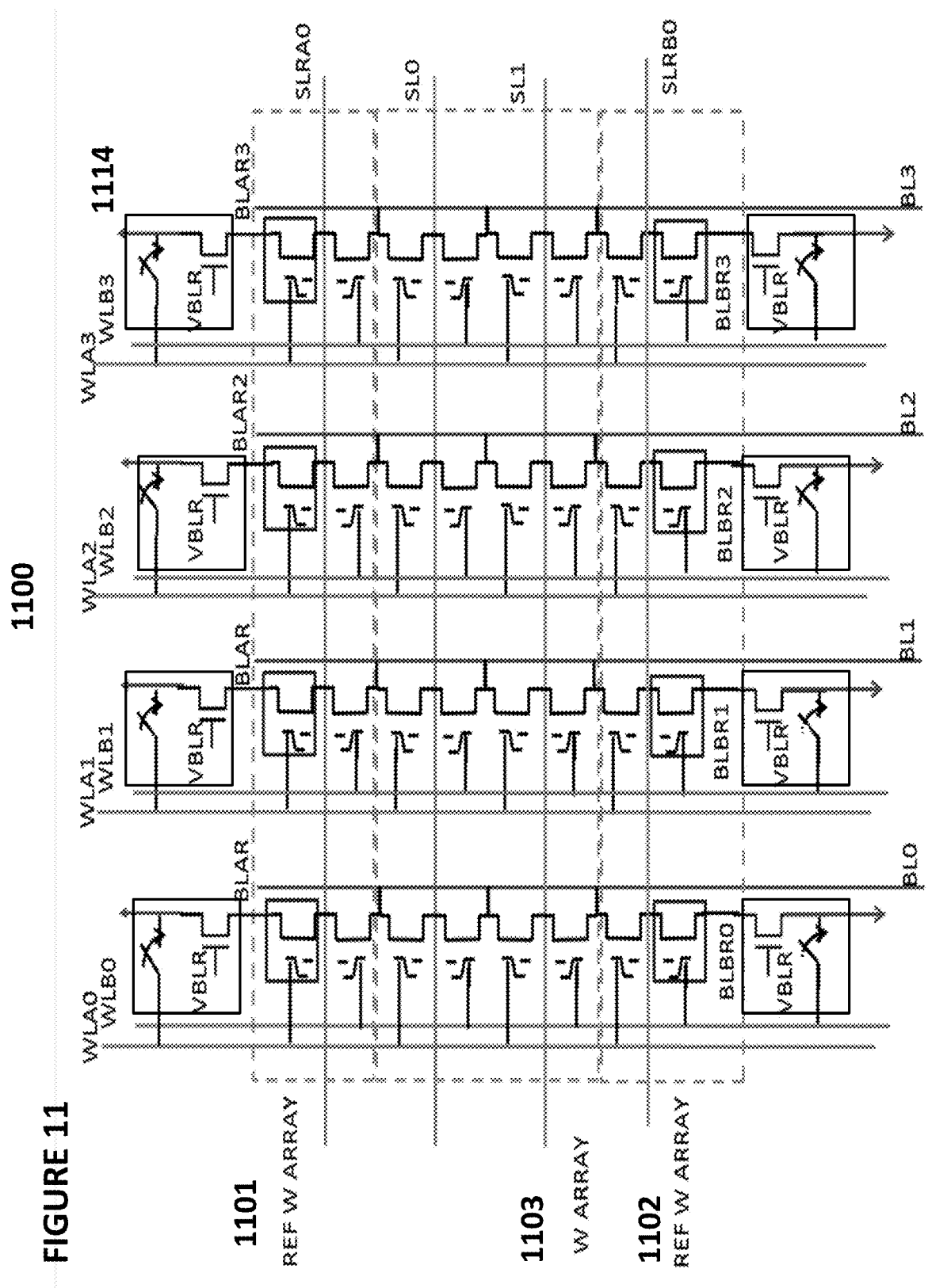
FIG. 11 depicts another embodiment of a vector multiplier matrix.

FIG. 11 depicts neuron VMM array 1100, which is particularly suited for memory cells 210 as shown in FIG. 2, and is utilized as the synapses and parts of neurons between an input layer and the next layer. VMM array 1100 comprises a memory array 1103 of non-volatile memory cells, reference array 1101 of first non-volatile reference memory cells, and reference array 1102 of second non-volatile reference memory cells. Reference arrays 1101 and 1102 run in row direction of the VMM array 1100. VMM array is similar to VMM 1000 except that in VMM array 1100, the word lines run in the vertical direction. Here, the inputs are provided on the word lines (WLA0, WLB0, WLA1, WLB2, WLA2, WLB2, WLA3, WLB3), and the output emerges on the source line (SL0, SL1) during a read operation. The current placed on each source line performs a summing function of all the currents from the memory cells connected to that particular source line.

Table No. 6 depicts operating voltages for VMM array 1100. The columns in the table indicate the voltages placed on word lines for selected cells, word lines for unselected cells, bit lines for selected cells, bit lines for unselected cells, source lines for selected cells, and source lines for unselected cells. The rows indicate the operations of read, erase, and program.

TABLE No. 6

Operation of VMM Array 1100 of FIG. 11

|  | WL | WL-unsel | BL | BL-unsel | SL | SL-unsel |
|---|---|---|---|---|---|---|
| Read | 1-3.5 V | −0.5 V/0 V | 0.6-2 V | 0.6 V-2 V/0 V | ~0.3-1 V (Ineuron) | 0 V |
| Erase | ~5-13 V | 0 V | 0 V | 0 V | 0 V | SL-inhibit (~4-8 V) |
| Program | 1-2 V | −0.5 V/0 V | 0.1-3 uA | Vinh ~2.5 V | 4-10 V | 0-1 V/FLT |

Figure 12:
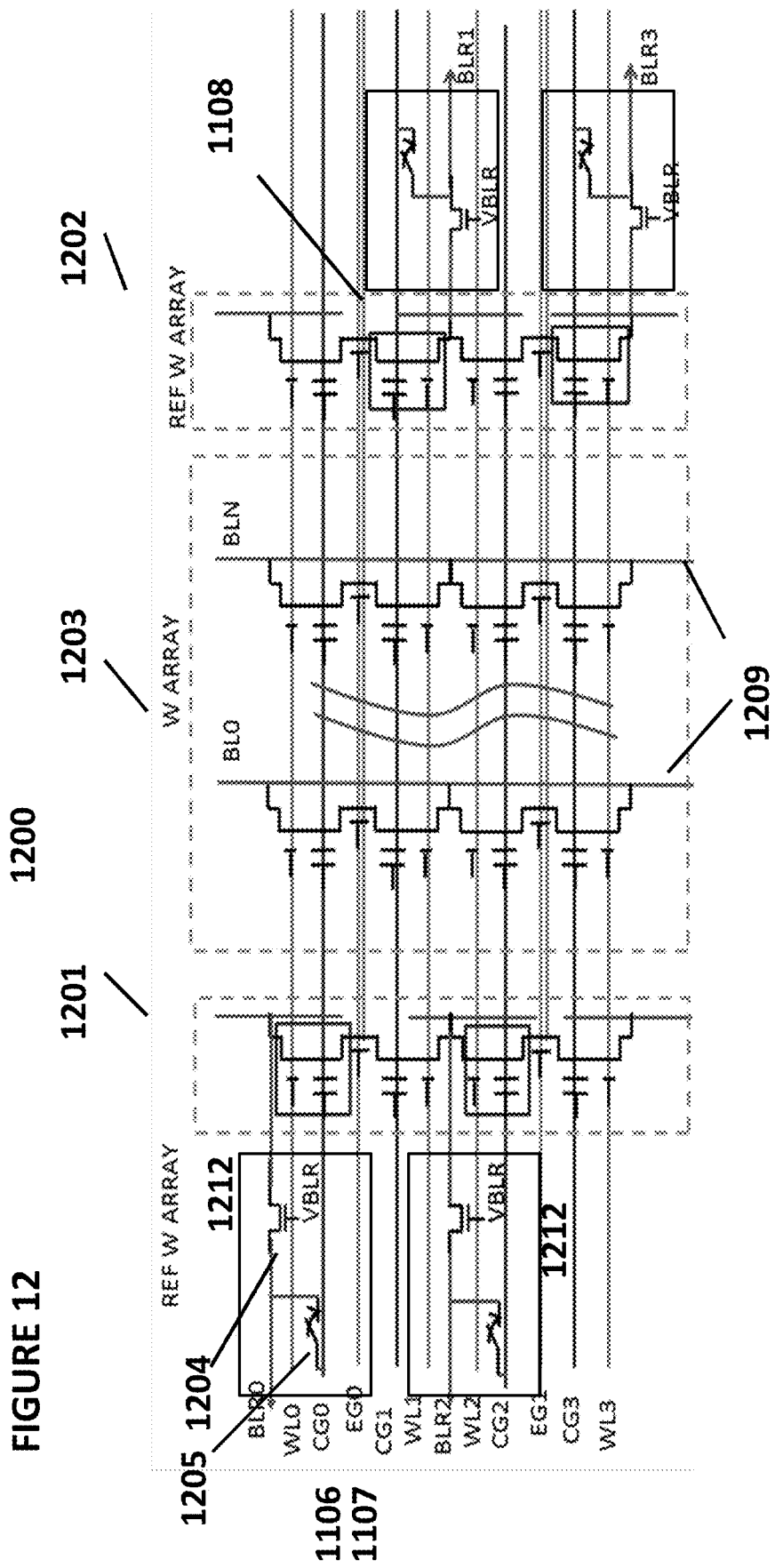
FIG. 12 depicts another embodiment of a vector multiplier matrix.

FIG. 12 depicts neuron VMM array 1200, which is particularly suited for memory cells 310 as shown in FIG. 3, and is utilized as the synapses and parts of neurons between an input layer and the next layer. VMM array 1200 comprises a memory array 1203 of non-volatile memory cells, reference array 1201 of first non-volatile reference memory cells, and reference array 1202 of second non-volatile reference memory cells. Reference arrays 1201 and 1202 serve to convert current inputs flowing into terminals BLR0, BLR1, BLR2, and BLR3 into voltage inputs CG0, CG1, CG2, and CG3. In effect, the first and second non-volatile reference memory cells are diode-connected through multiplexors 1212 with current inputs flowing into them through BLR0, BLR1, BLR2, and BLR3. Multiplexors 1212 each include a respective multiplexor 1205 and a cascoding transistor 1204 to ensure a constant voltage on the bitline (such as BLR0) of each of the first and second non-volatile reference memory cells during a read operation. The reference cells are tuned to target reference levels.

Memory array 1203 serves two purposes. First, it stores the weights that will be used by the VMM array 1200. Second, memory array 1203 effectively multiplies the inputs (current inputs provided to terminals BLR0, BLR1, BLR2, and BLR3, for which reference arrays 1201 and 1202 convert these current inputs into the input voltages to supply to the control gates (CG0, CG1, CG2, and CG3) by the weights stored in the memory array and then add all the results (cell currents) to produce the output, which appears on BL0-BLN, and will be the input to the next layer or input to the final layer. By performing the multiplication and addition function, the memory array negates the need for separate multiplication and addition logic circuits and is also power efficient. Here, the inputs are provided on the control gate lines (CG0, CG1, CG2, and CG3), and the output emerges on the bitlines (BL0-BLN) during a read operation. The current placed on each bitline performs a summing function of all the currents from the memory cells connected to that particular bitline.

VMM array 1200 implements uni-directional tuning for non-volatile memory cells in memory array 1203. That is, each non-volatile memory cell is erased and then partially programmed until the desired charge on the floating gate is reached. This can be performed, for example, using the novel precision programming techniques described below. If too much charge is placed on the floating gate (such that the wrong value is stored in the cell), the cell must be erased and the sequence of partial programming operations must start over. As shown, two rows sharing the same erase gate (such as EG0 or EG1) need to be erased together (which is known as a page erase), and thereafter, each cell is partially programmed until the desired charge on the floating gate is reached.

Table No. 7 depicts operating voltages for VMM array 1200. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

TABLE No. 7

Operation of VMM Array 1200 of FIG. 12

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 0-2.6 V | 0-2.6 V | 5-12 V | 0-2.6 V | 0 V | 0 V |
| Program | 0.7-1 V | −0.5 V/0 V | 0.1-1 uA | Vinh (1-2 V) | 4-11 V | 0-2.6 V | 0-2.6 V | 4.5-5 V | 0-2.6 V | 4.5-5 V | 0-1 V |

Figure 13:
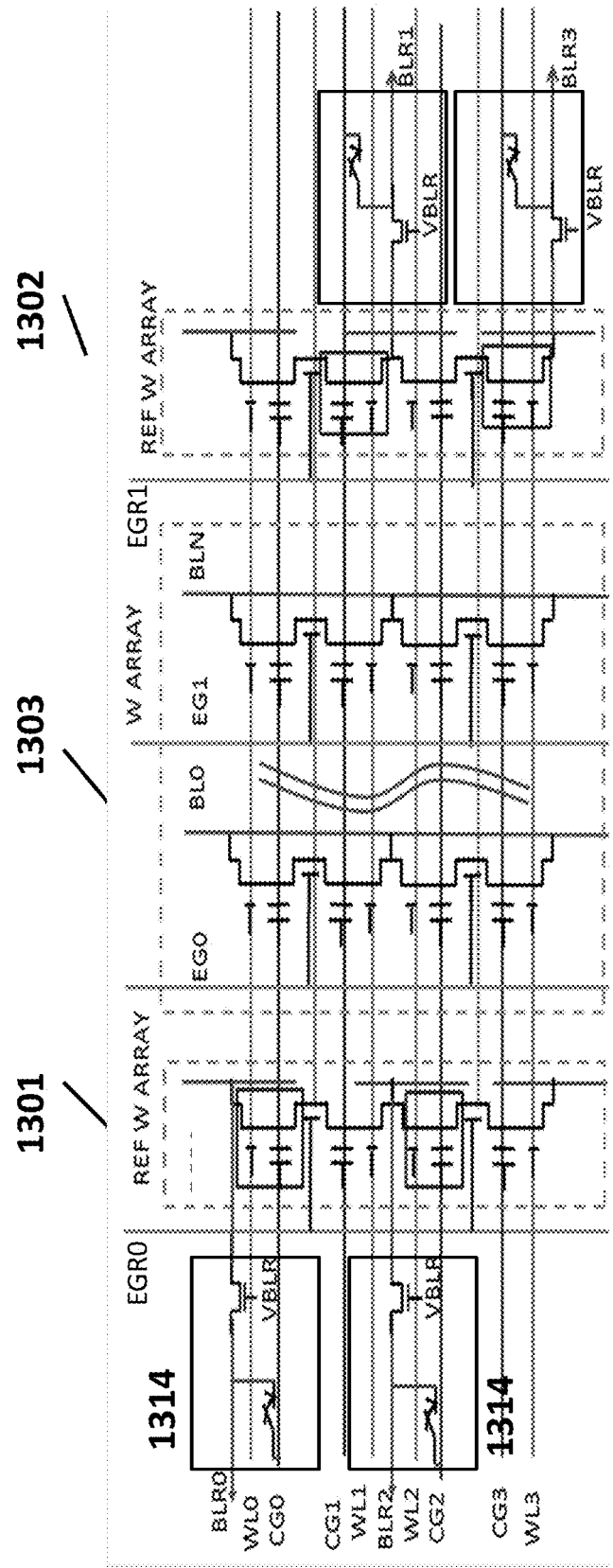
FIG. 13 depicts another embodiment of a vector multiplier matrix.

FIG. 13 depicts neuron VMM array 1300, which is particularly suited for memory cells 310 as shown in FIG. 3, and is utilized as the synapses and parts of neurons between an input layer and the next layer. VMM array 1300 comprises a memory array 1303 of non-volatile memory cells, reference array 1301 or first non-volatile reference memory cells, and reference array 1302 of second non-volatile reference memory cells. EG lines EGR0, EG0, EG1 and EGR1 are run vertically while CG lines CG0, CG1, CG2 and CG3 and SL lines WL0, WL1, WL2 and WL3 are run horizontally. VMM array 1300 is similar to VMM array 1400, except that VMM array 1300 implements bi-directional tuning, where each individual cell can be completely erased, partially programmed, and partially erased as needed to reach the desired amount of charge on the floating gate due to the use of separate EG lines. As shown, reference arrays 1301 and 1302 convert input current in the terminal BLR0, BLR1, BLR2, and BLR3 into control gate voltages CG0, CG1, CG2, and CG3 (through the action of diode-connected reference cells through multiplexors 1314) to be applied to the memory cells in the row direction. The current output (neuron) is in the bitlines BL0-BLN, where each bit line sums all currents from the non-volatile memory cells connected to that particular bitline.

Table No. 8 depicts operating voltages for VMM array 1300. The columns in the table indicate the voltages placed on word lines for selected cells, word lines for unselected cells, bit lines for selected cells, bit lines for unselected cells, control gates for selected cells, control gates for unselected cells in the same sector as the selected cells, control gates for unselected cells in a different sector than the selected cells, erase gates for selected cells, erase gates for unselected cells, source lines for selected cells, and source lines for unselected cells. The rows indicate the operations of read, erase, and program.

Figure 14:
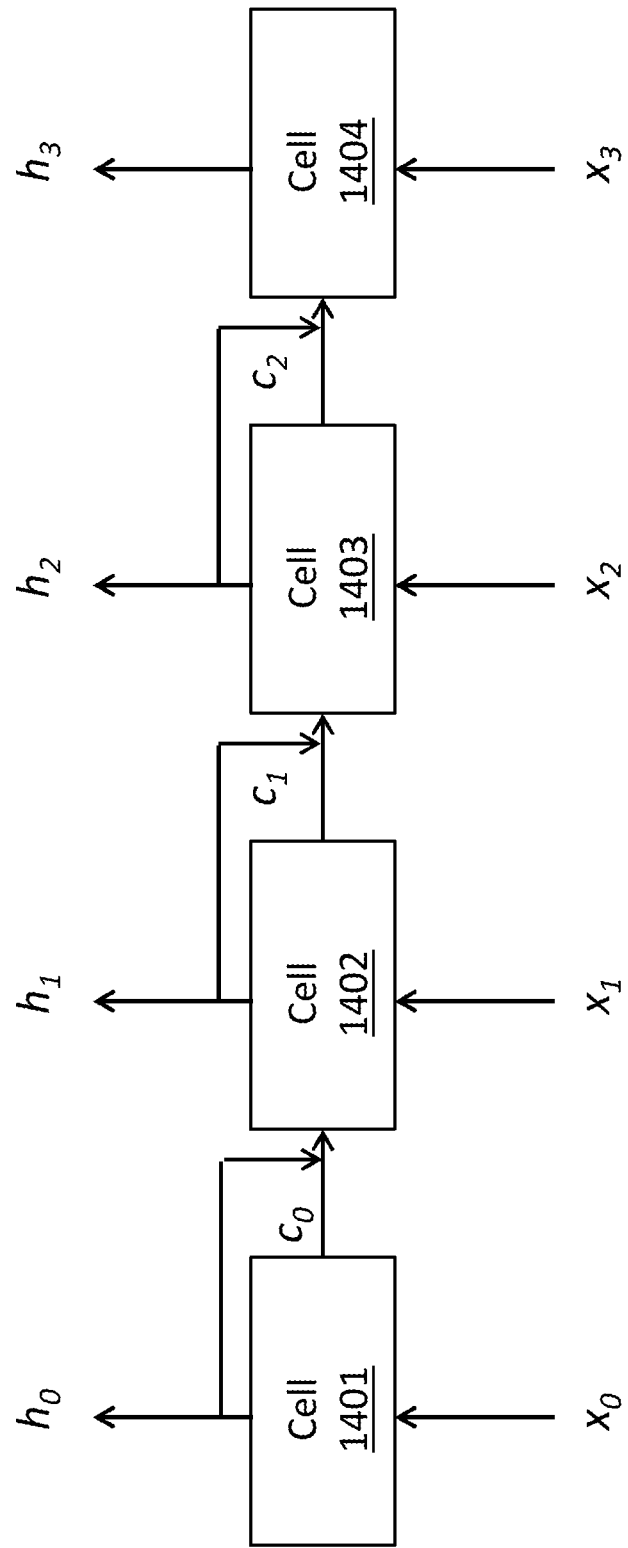
FIG. 14 depicts a prior art long short term memory system.

1403, and 1404 in FIG. 14. LSTM cell 1500 receives input vector x(t), cell state vector c(t−1) from a preceding cell, and output vector h(t−1) from a preceding cell, and generates cell state vector c(t) and output vector h(t).

LSTM cell 1500 comprises sigmoid function devices 1501, 1502, and 1503, each of which applies a number between 0 and 1 to control how much of each component in the input vector is allowed through to the output vector. LSTM cell 1500 also comprises tan h devices 1504 and 1505 to apply a hyperbolic tangent function to an input vector, multiplier devices 1506, 1507, and 1508 to multiply two vectors together, and addition device 1509 to add two vectors together. Output vector h(t) can be provided to the next LSTM cell in the system, or it can be accessed for other purposes.

Figure 16:
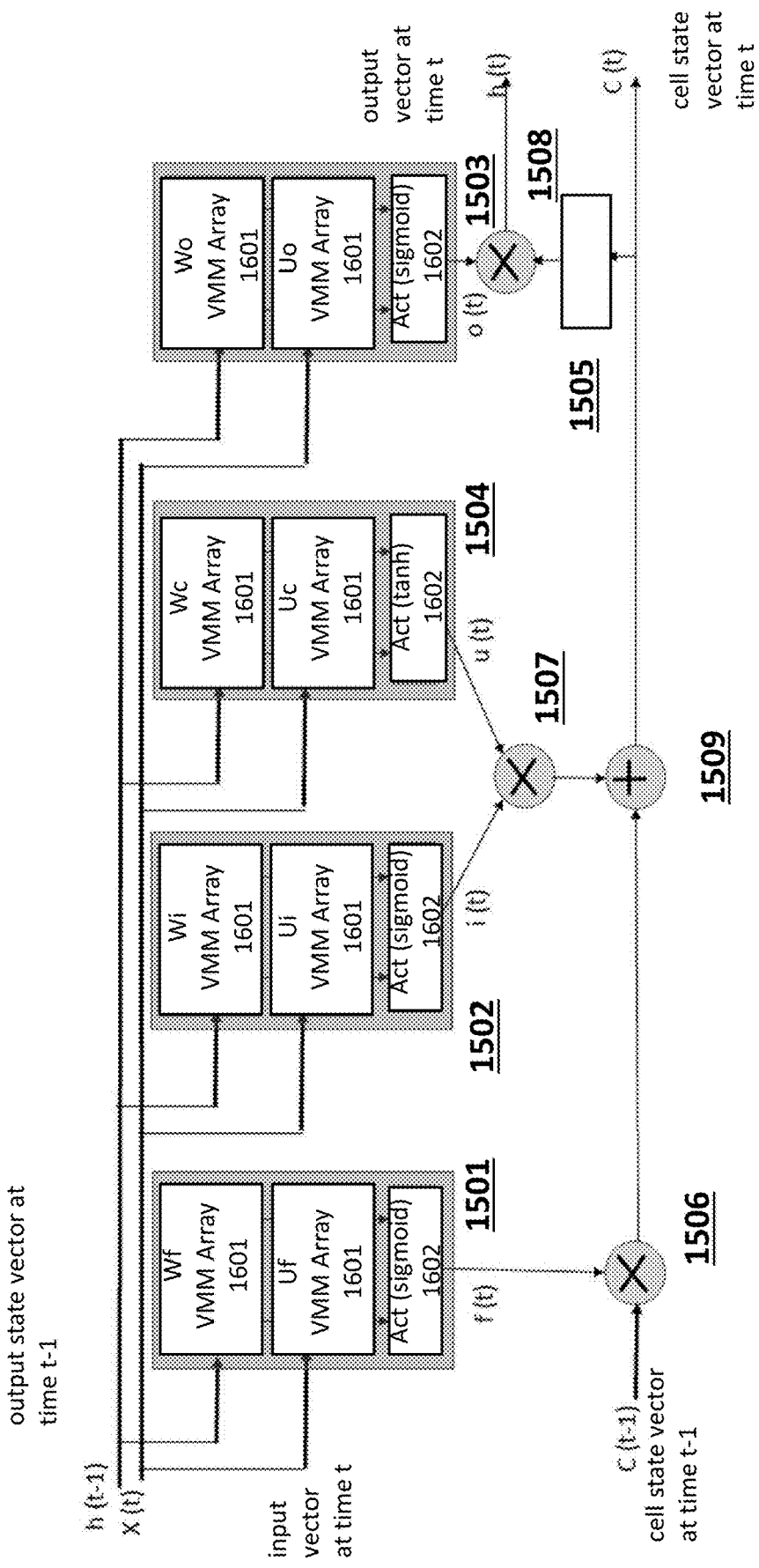
FIG. 16 depicts an implementation of the exemplary cell in a long short term memory system of FIG. 15.

FIG. 16 depicts an LSTM cell 1600, which is an example of an implementation of LSTM cell 1500. For the reader's convenience, the same numbering from LSTM cell 1500 is used in LSTM cell 1600. Sigmoid function devices 1501, 1502, and 1503 and tan h device 1504 each comprise multiple VMM arrays 1601 and activation circuit blocks 1602. Thus, it can be seen that VMM arrays are particular useful in LSTM cells used in certain neural network systems.

Figure 17:
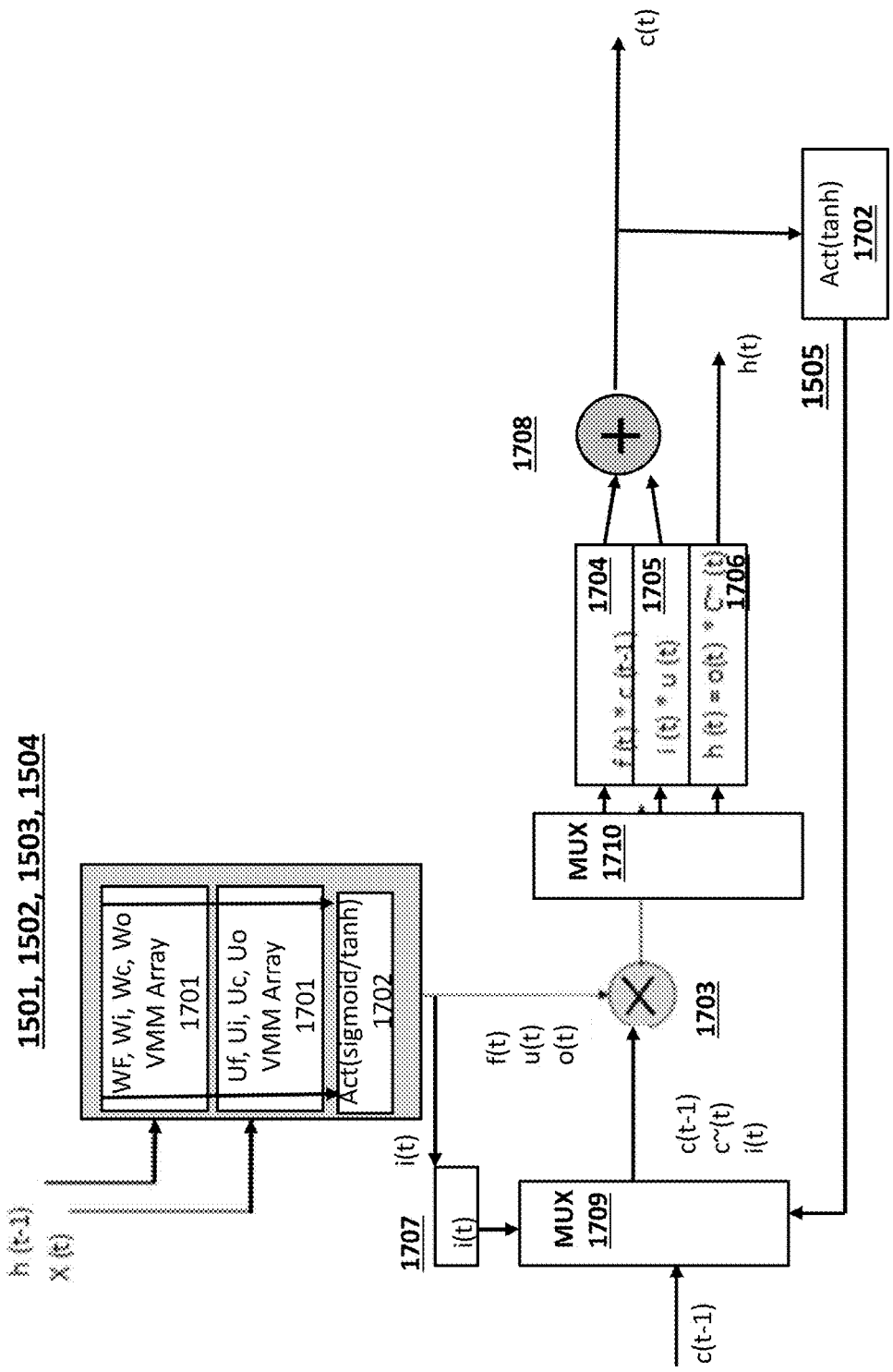
FIG. 17 depicts another implementation of the exemplary cell in a long short term memory system of FIG. 15.

An alternative to LSTM cell 1600 (and another example of an implementation of LSTM cell 1500) is shown in. FIG. 17. In FIG. 17, sigmoid function devices 1501, 1502, and TABLE No. 8

Operation of VMM Array 1300 of FIG. 13

|  | WL | WL-unsel | BL | BL-unsel | CG | CG-unsel same sector | CG-unsel | EG | EG-unsel | SL | SL-unsel |
|---|---|---|---|---|---|---|---|---|---|---|---|
| Read | 1.0-2 V | −0.5 V/ 0 V | 0.6-2 V (Ineuron) | 0 V | 0-2.6 V | 0-2.6 V | 0-2.6 V | 0-2.6 V | 0-2.6 V | 0 V | 0 V |
| Erase | 0 V | 0 V | 0 V | 0 V | 0 V | 4-9 V | 0-2.6 V | 5-12 V | 0-2.6 V | 0 V | 0 V |
| Program | 0.7-1 V | −0.5 V/ 0 V | 0.1-1 uA | Vinh (1-2 V) | 4-11 V | 0-2.6 V | 0-2.6 V | 4.5-5 V | 0-2.6 V | 4.5-5 V | 0-1 V |

Long Short-Term Memory

The prior art includes a concept known as long short-term memory (LSTM). LSTM units often are used in neural networks. LSTM allows a neural network to remember information over predetermined arbitrary time intervals and to use that information in subsequent operations. A conventional LSTM unit comprises a cell, an input gate, an output gate, and a forget gate. The three gates regulate the flow of information into and out of the cell and the time interval that the information is remembered in the LSTM. VMMs are particularly useful in LSTM units.

FIG. 14 depicts an exemplary LSTM 1400. LSTM 1400 in this example comprises cells 1401, 1402, 1403, and 1404. Cell 1401 receives input vector $x_0$ and generates output vector $h_0$ and cell state vector $c_0$. Cell 1402 receives input vector $x_1$, the output vector (hidden state) $h_0$ from cell 1401, and cell state $c_0$ from cell 1401 and generates output vector $h_1$ and cell state vector $c_1$. Cell 1403 receives input vector $x_2$, the output vector (hidden state) $h_1$ from cell 1402, and cell state $c_1$ from cell 1402 and generates output vector $h_2$ and cell state vector $c_2$. Cell 1404 receives input vector $x_3$, the output vector (hidden state) $h_2$ from cell 1403, and cell state $c_2$ from cell 1403 and generates output vector $h_3$. Additional cells can be used, and an LSTM with four cells is merely an example.

Figure 15:
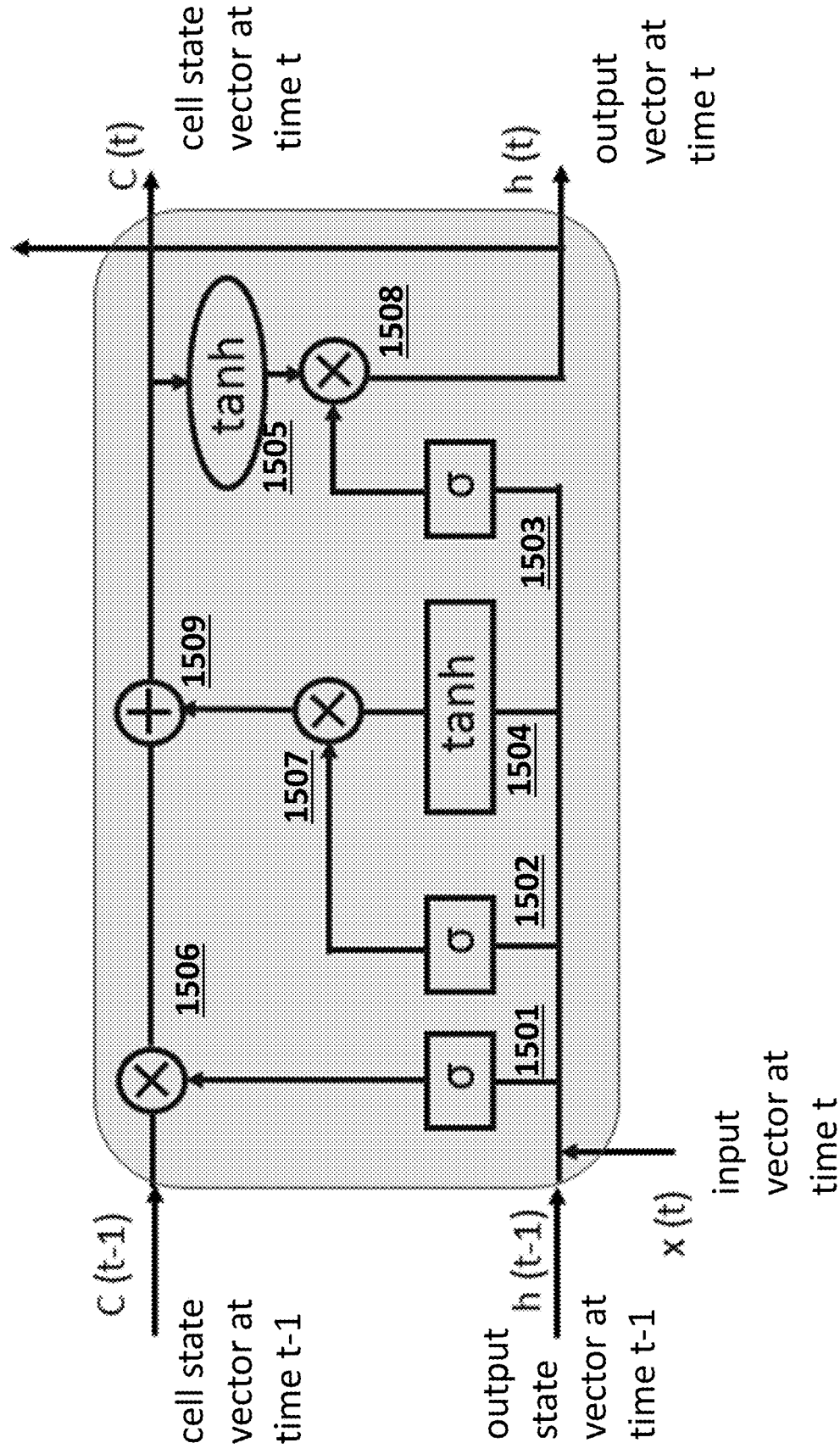
FIG. 15 depicts an exemplary cell in a prior art long short term memory system.

FIG. 15 depicts an exemplary implementation of an LSTM cell 1500, which can be used for cells 1401, 1402,

1503 and tan h device 1504 share the same physical hardware (VMM arrays 1701 and activation function block 1702) in a time-multiplexed fashion. LSTM cell 1700 also comprises multiplier device 1703 to multiply two vectors together, addition device 1708 to add two vectors together, tan h device 1505 (which comprises activation circuit block 1702), register 1707 to store the value i(t) when i(t) is output from sigmoid function block 1702, register 1704 to store the value f(t)*c(t−1) when that value is output from multiplier device 1703 through multiplexor 1710, register 1705 to store the value i(t)*u(t) when that value is output from multiplier device 1703 through multiplexor 1710, and register 1706 to store the value o(t)*c~(t) when that value is output from multiplier device 1703 through multiplexor 1710, and multiplexor 1709.

Whereas LSTM cell 1600 contains multiple sets of VMM arrays 1601 and respective activation function blocks 1602, LSTM cell 1700 contains only one set of VMM arrays 1701 and activation function block 1702, which are used to represent multiple layers in the embodiment of LSTM cell 1700. LSTM cell 1700 will require less space than LSTM 1600, as LSTM cell 1700 will require ¼ as much space for VMMs and activation function blocks compared to LSTM cell 1600.

It can be further appreciated that LSTM units will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

Gated Recurrent Units

An analog VMM implementation can be utilized for a GRU (gated recurrent unit) system. GRUs are a gating mechanism in recurrent neural networks. GRUs are similar to LSTMs, except that GRU cells generally contain fewer components than an LSTM cell.

Figure 18:
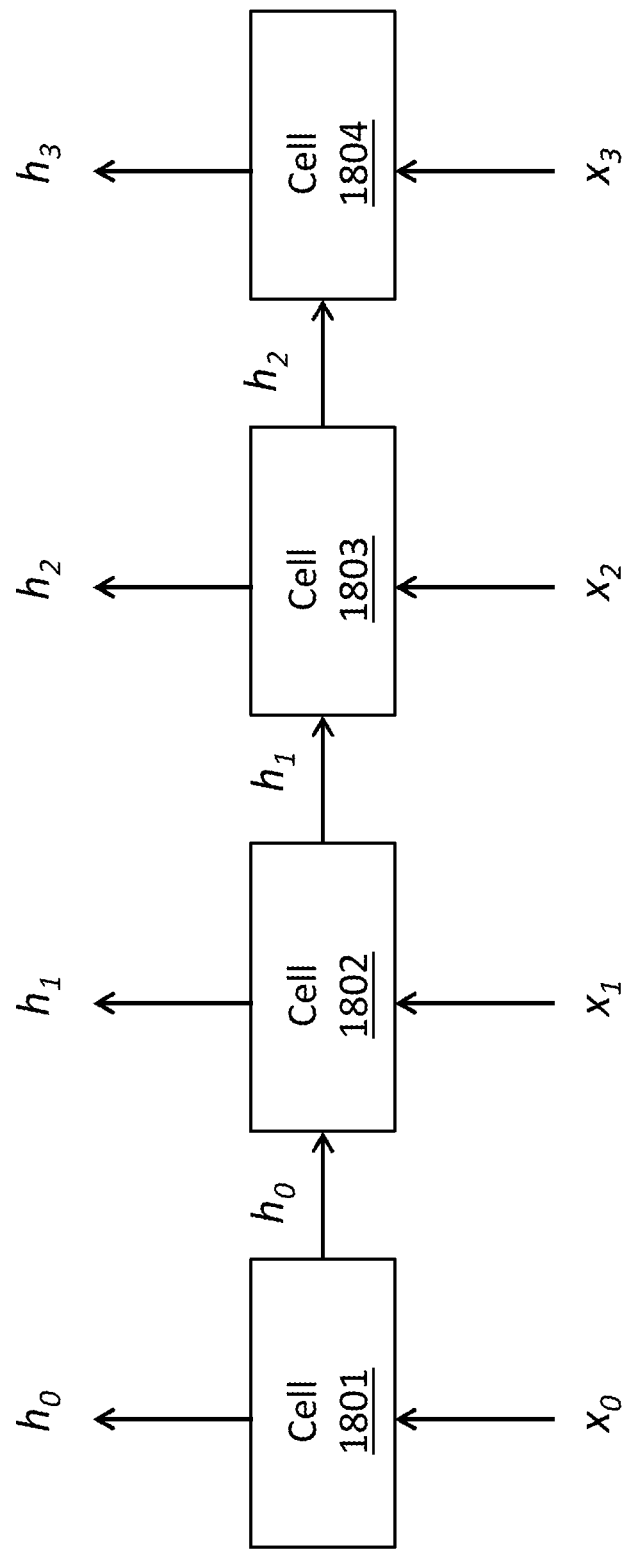
FIG. 18 depicts a prior art gated recurrent unit system.

FIG. 18 depicts an exemplary GRU 1800. GRU 1800 in this example comprises cells 1801, 1802, 1803, and 1804. Cell 1801 receives input vector $x_0$ and generates output vector $h_0$. Cell 1802 receives input vector $x_1$, the output vector (hidden state) $h_0$ from cell 1801 and generates output vector $h_1$. Cell 1803 receives input vector $x_2$ and the output vector (hidden state) $h_1$ from cell 1802 and generates output vector $h_2$. Cell 1804 receives input vector $x_3$ and the output vector (hidden state) $h_2$ from cell 1803 and generates output vector $h_3$. Additional cells can be used, and an GRU with four cells is merely an example.

Figure 19:
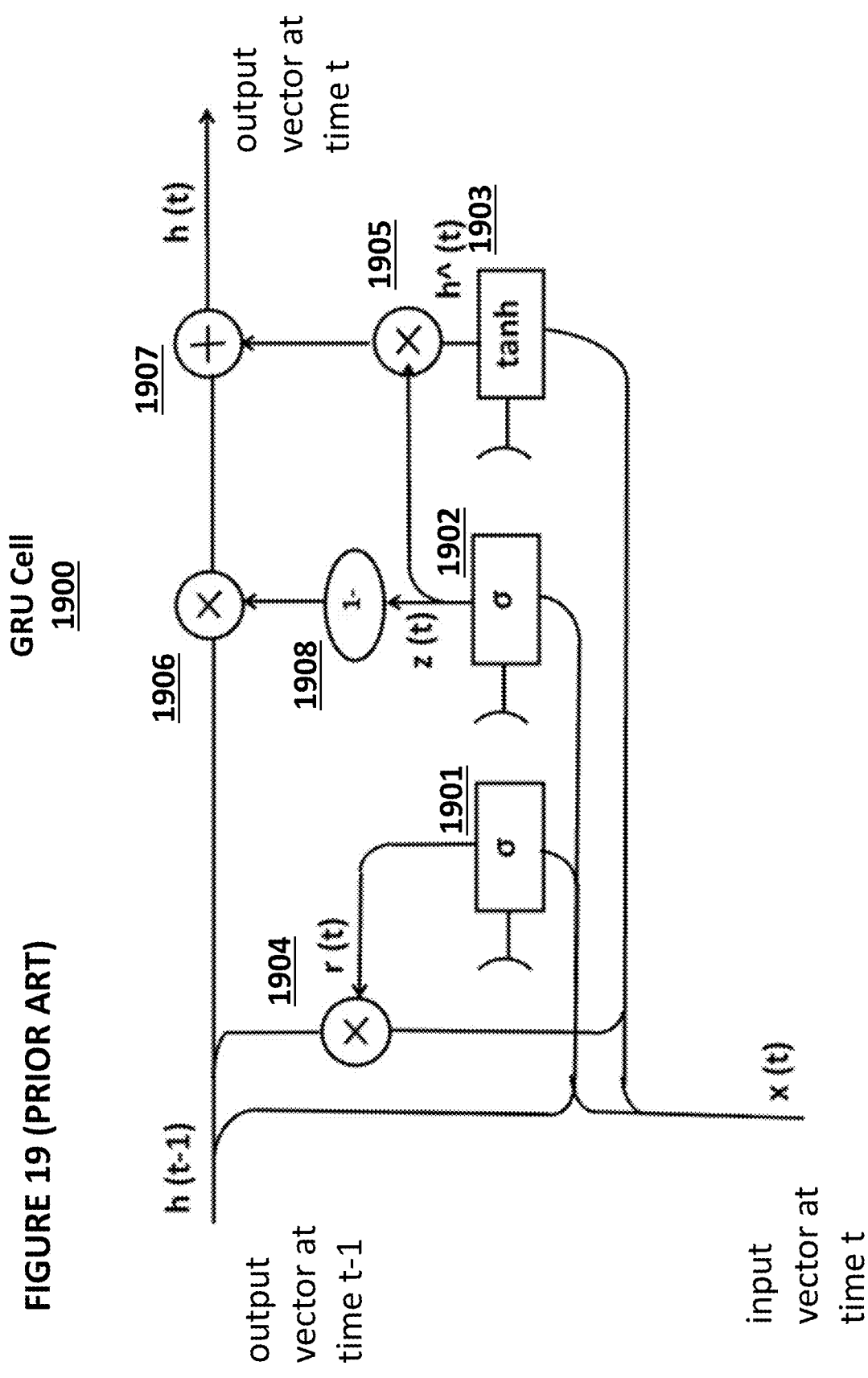
FIG. 19 depicts an exemplary cell in a prior art gated recurrent unit system.

FIG. 19 depicts an exemplary implementation of a GRU cell 1900, which can be used for cells 1801, 1802, 1803, and 1804 of FIG. 18. GRU cell 1900 receives input vector x(t) and output vector h(−1) from a preceding GRU cell and generates output vector h(t). GRU cell 1900 comprises sigmoid function devices 1901 and 1902, each of which applies a number between 0 and 1 to components from output vector h(−1) and input vector x(t). GRU cell 1900 also comprises a tan h device 1903 to apply a hyperbolic tangent function to an input vector, a plurality of multiplier devices 1904, 1905, and 1906 to multiply two vectors together, an addition device 1907 to add two vectors together, and a complementary device 1908 to subtract an input from 1 to generate an output.

Figure 20:
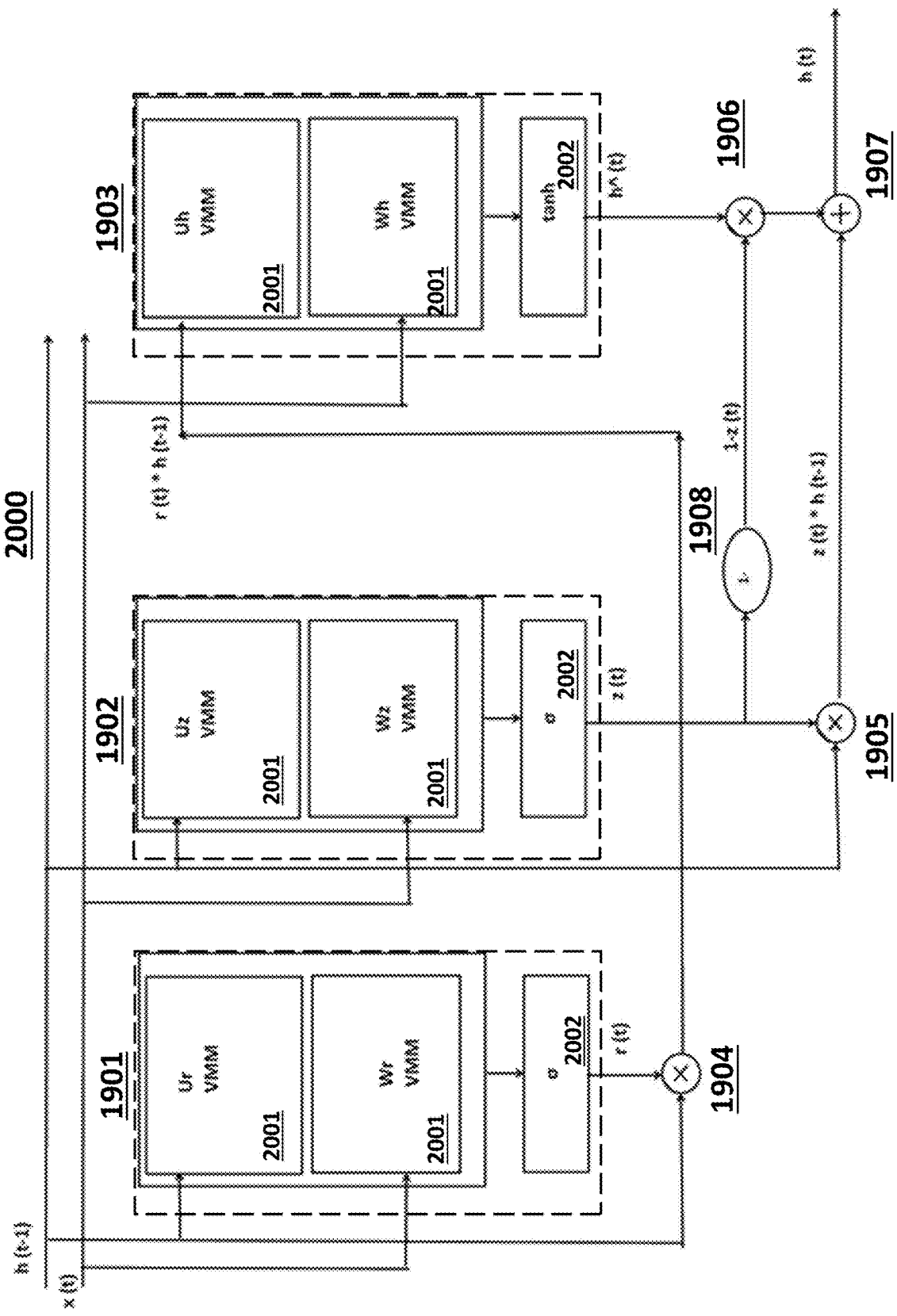
FIG. 20 depicts an implementation of the exemplary cell in the gated recurrent unit system of FIG. 19.

FIG. 20 depicts a GRU cell 2000, which is an example of an implementation of GRU cell 1900. For the reader's convenience, the same numbering from GRU cell 1900 is used in GRU cell 2000. As can be seen in FIG. 20, sigmoid function devices 1901 and 1902, and tan h device 1903 each comprise multiple VMM arrays 2001 and activation function blocks 2002. Thus, it can be seen that VMM arrays are of particular use in GRU cells used in certain neural network systems.

Figure 21:
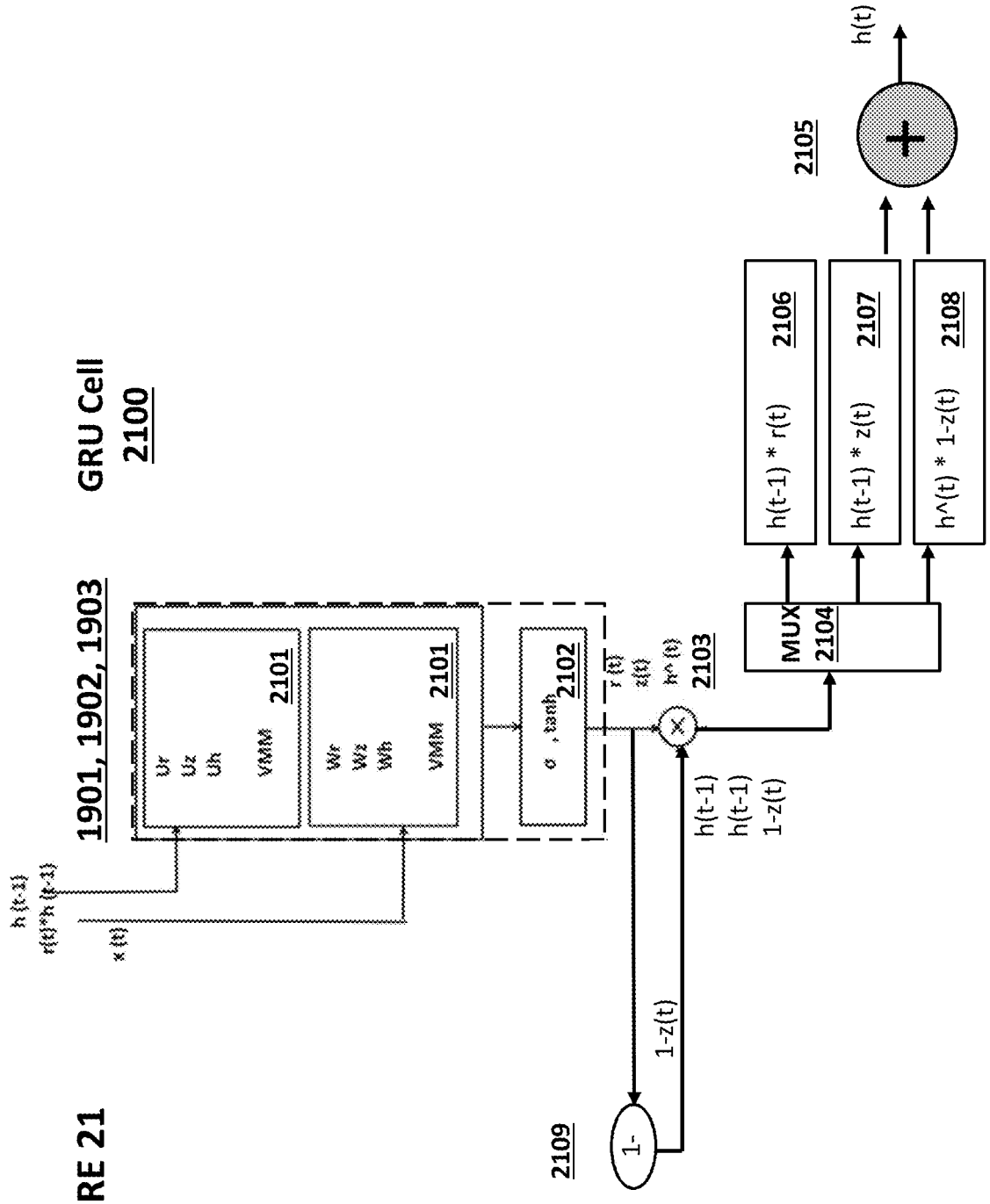
FIG. 21 depicts another embodiment of the exemplary cell in the gated recurrent unit system of FIG. 19.

An alternative to GRU cell 2000 (and another example of an implementation of GRU cell 1900) is shown in FIG. 21. In FIG. 21, GRU cell 2100 utilizes VMM arrays 2101 and activation function block 2102, which when configured as a sigmoid function applies a number between 0 and 1 to control how much of each component in the input vector is allowed through to the output vector. In FIG. 21, sigmoid function devices 1901 and 1902 and tan h device 1903 share the same physical hardware (VMM arrays 2101 and activation function block 2102) in a time-multiplexed fashion. GRU cell 2100 also comprises multiplier device 2103 to multiply two vectors together, addition device 2105 to add two vectors together, complementary device 2109 to subtract an input from 1 to generate an output, multiplexor 2104, register 2106 to hold the value h(t−1)*r(t) when that value is output from multiplier device 2103 through multiplexor 2104, register 2107 to hold the value h(t−1)*z(t) when that value is output from multiplier device 2103 through multiplexor 2104, and register 2108 to hold the value hˆ(t)*(1-z(t)) when that value is output from multiplier device 2103 through multiplexor 2104.

Whereas GRU cell 2000 contains multiple sets of VMM arrays 2001 and activation function blocks 2002, GRU cell 2100 contains only one set of VMM arrays 2101 and activation function block 2102, which are used to represent multiple layers in the embodiment of GRU cell 2100. GRU cell 2100 will require less space than GRU cell 2000, as GRU cell 2100 will require ⅓ as much space for VMMs and activation function blocks compared to GRU cell 2000.

It can be further appreciated that GRU systems will typically comprise multiple VMM arrays, each of which requires functionality provided by certain circuit blocks outside of the VMM arrays, such as a summer and activation circuit block and high voltage generation blocks. Providing separate circuit blocks for each VMM array would require a significant amount of space within the semiconductor device and would be somewhat inefficient. The embodiments described below therefore attempt to minimize the circuitry required outside of the VMM arrays themselves.

The input to the VMM arrays can be an analog level, a binary level, or digital bits (in this case a DAC is needed to convert digital bits to appropriate input analog level) and the output can be an analog level, a binary level, or digital bits (in this case an output ADC is needed to convert output analog level into digital bits).

For each memory cell in a VMM array, each weight w can be implemented by a single memory cell or by a differential cell or by two blend memory cells (average of 2 cells). In the differential cell case, two memory cells are needed to implement a weight w as a differential weight (w=w+−w−). In the two blend memory cells, two memory cells are needed to implement a weight w as an average of two cells.

Configurable Arrays

Figure 22:
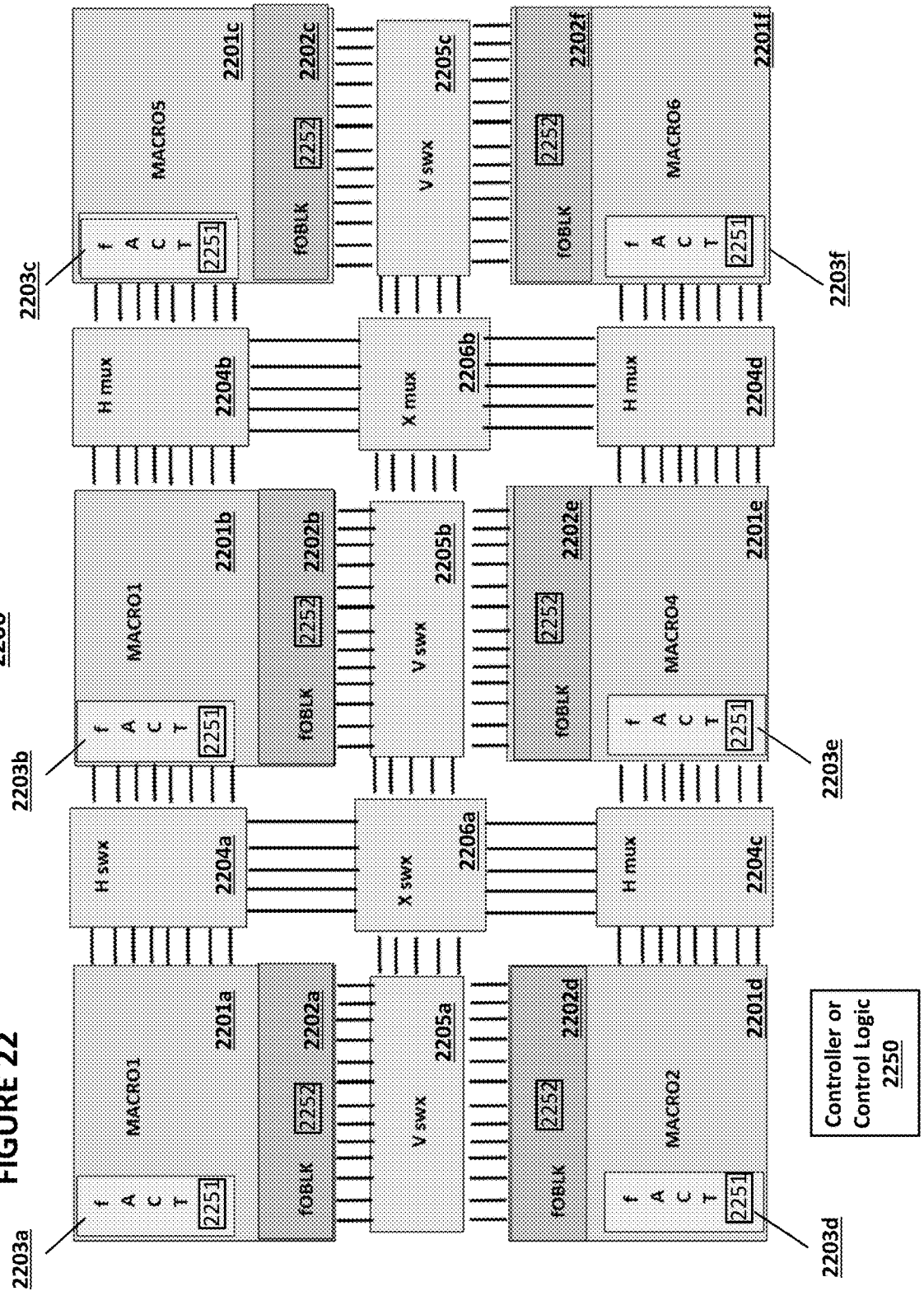
FIG. 22 depicts a configurable flash analog neuro memory system.

FIG. 22 depicts configurable flash analog neuromorphic memory system 2200. Configurable flash analog neuro memory system 2200 comprises macro blocks 2201a, 2201b, 2201c, 2201d, 2201e, and 2201f; neuron output (such as summer circuit and a sample and hold S/H circuit) blocks 2202a, 2202b, 2202c, 2202d, 2202e, and 2202f; activation circuit blocks 2203a, 2203b, 2203c, 2203d, 2203e, and 2203f; horizontal multiplexors 2204a, 2204b, 2204c, and 2204d; vertical multiplexors 2205a, 2205b, and 2205c; and cross multiplexors 2206a and 2206b. Each of macro blocks 2201a, 2201b, 2201c, 2201d, 2201e, and 2201f is a VMM sub-system containing a VMM array.

In one embodiment, neuron output blocks 2202a, 2202b, 2202c, 2202d, 2202e, and 2202f each includes a buffer (e.g., op amp) low impedance output type circuit that can drive a long, configurable interconnect. In one embodiment, activation circuit blocks 2203a, 2203b, 2203c, 2203d, 2203e, and 2203f provide the summing, high impedance current outputs. Alternatively, neuron output blocks 2202a, 2202b, 2202c, 2202d, 2202e, and 2202f can include the activation circuits, in which case additional low impedance buffers will be needed to drive the outputs.

It is to be understood by one of ordinary skill in the art that activation circuit blocks 2203a, 2203b, 2203c, 2203d, 2203e, and 2203f are just one example of a type of input block, and that configurable flash analog neuro memory system 2200 instead can be designed with other input blocks in place of activation circuit blocks 2203a, 2203b, 2203c, 2203d, 2203e, and 2203f, such that those blocks become input blocks 2203a, 2203b, 2203c, 2203d, 2203e, and 2203f.

In one embodiment, neuron output blocks 2202a, 2202b, 2202c, 2202d, 2202e, and 2202f each comprises analog-to-digital conversion block 2252 that output digital bits instead of analog signals. Those digital bits are then routed to the desired location using configurable interconnects of FIG. 22. In this embodiment, activation circuit blocks 2203a, 2203b, 2203c, 2203d, 2203e, and 2203f each comprises digital-to-analog conversion block 2251 that receives digital bits from the interconnects of FIG. 22 and converts the digital bits into analog signals.

In instances where configurable system 2200 is used to implement an LSTM or GRU, output blocks 2202a, 2202b, 2202c, 2202d, 2202e, and 2202f and/or input blocks 2203a, 2203b, 2203c, 2203d, 2203e, and 2203f may include multiplier block, addition block, subtraction (output=1−input) block as needed for LSTM/GRU architecture, and optionally may include analog sample-and-hold circuits (such as circuits 3600 or 3650 in FIG. 36) or digital sample-and-hold circuits (e.g., a register or SRAM) as needed.

Configurability includes the width of neurons (number of outputs convolution layer, such as bitlines), the width of inputs (number of inputs per convolution layer, such as number of rows) by combining multiple macros and/or configuring each individual macros to have only parts of neuron output and/or input circuit active.

Within a VMM array, time multiplexing can be used to enable multiple timed passes to maximize usage of the array. For example first N rows or N columns of an array can be enabled (sampled) at time t0 and its result is held in a t0 sample and hold S/H circuit, the next N rows or N columns can be enabled at time t1 and its result is held in a t1 sample and hold S/H circuit, and so on. And at final time tf, all previous S/H results is combined appropriately to give final output.

As can be appreciated, one requirement of an analog neuro memory system is the ability to collect outputs from one layer and provide them as inputs to another layer. This results in a complicated routing scheme where the outputs from one VMM array might need to be routed as inputs to another VMM array that is not necessarily immediately adjacent to it. In FIG. 22, this routing function is provided by horizontal multiplexors 2204a, 2204b, 2204c, and 2204d; vertical multiplexors 2205a, 2205b, and 2205c; and cross multiplexors 2206a and 2206b. Using these multiplexors, the outputs from any of the macro blocks 2201a, 2201b, 2201c, 2201d, 2201e, and 2201f can be routed as inputs to any of the other macro blocks in 2201a, 2201b, 2201c, 2201d, 2201e, and 2201f. This functionality is critical to creating a configurable system.

Configurable flash analog neuro memory system 2200 also comprises controller or control logic 2250. Controller or control logic 2250 optionally is a microcontroller running software code to perform the configurations described herein (controller), or hardware logic for performing the configurations described herein (control logic), including activation of horizontal multiplexors 2204a, 2204b, 2204c, and 2204d; vertical multiplexors 2205a, 2205b, and 2205c; and cross multiplexors 2206a and 2206b to perform the needed routing functions at each cycle.

Figure 23:
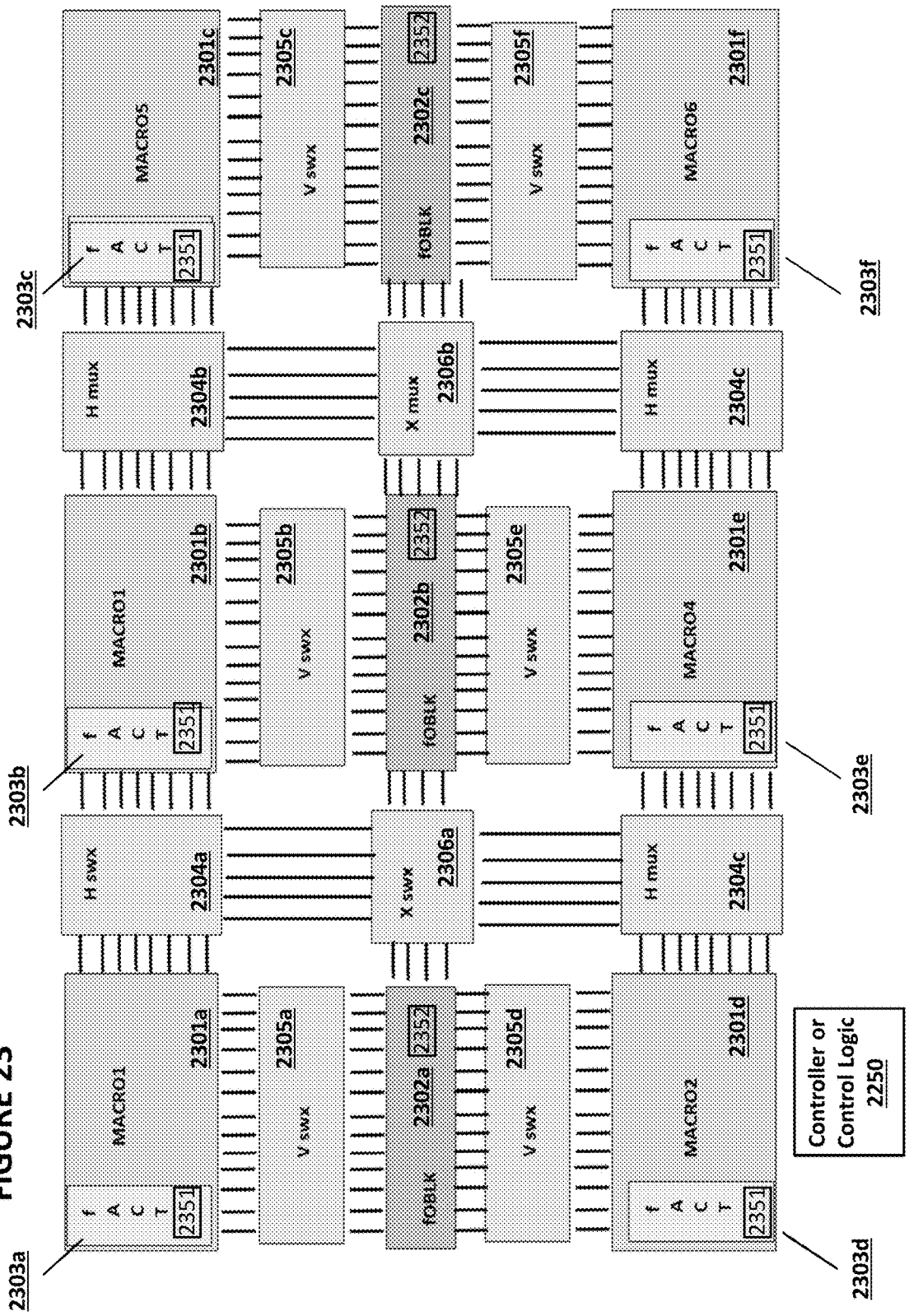
FIG. 23 depicts another configurable flash analog neuro memory system.

FIG. 23 depicts configurable flash analog neuro memory system 2300. Configurable flash analog neuro memory system 2300 comprises macro blocks 2301a, 2301b, 2301c, 2301d, 2301e, and 2301f; neuron output blocks (such as summer circuit and a sample and hold S/H circuit) 2302a, 2302b, and 2302c; activation circuit blocks 2303a, 2303b, 2303c, 2303d, 2303e, and 2303f; horizontal multiplexors 2304a, 2304b, 2304c, and 2304d; vertical multiplexors 2305a, 2305b, 2305c, 2305d, 2305e, and 2305f; and cross multiplexors 2306a and 2306b. Each of macro blocks 2301a, 2301b, 2301c, 2301d, 2301e, and 2301f is a VMM sub-system containing a VMM array. Neuron output blocks 2302a, 2302b, and 2302c are configured to be shared across macros.

As can be seen, the systems of FIGS. 22 and 23 are similar except that the system of FIG. 23 has shared configurable neuron output blocks (i.e., neuron output blocks 2302a, 2302b, and 2302c). In FIG. 23, the routing function is provided by horizontal multiplexors 2304a, 2304b, 2304c, and 2304d, vertical multiplexors 2305a, 2305b, 2305c, 2305d, 2305d, and 2305f and cross multiplexors 2306a and 2306b. Using these multiplexors, the outputs from any of the macro blocks 2301a, 2301b, 2301c, 2301d, 2301e, and 2301f can be routed as inputs to some (but not all) of the other macro blocks in 2301a, 2301b, 2301c, 2301d, 2301e, and 2301f. This allows some configurability with a lesser space requirement than the system of FIG. 22 due to the lack of vertical multiplexors.

Neuron output blocks 2302a, 2302b, and 2302c may include current summer circuit blocks and/or activation circuit blocks. Neuron output block 2302a, for example, can be configured to connect to an output of the macro block 2301a or to an output of the macro block 2301d. Or the neuron output block 2302a, for example, can be configured to connect to part of an output of the macro block 2301a and part of an output of the macro block 2301d.

It is to be understood by one of ordinary skill in the art that activation circuit blocks 2303a, 2303b, 2303c, 2303d, 2303e, and 2303f are just one example of a type of input block, and that configurable flash analog neuro memory system 2300 instead can be designed with other input blocks in place of activation circuit blocks 2303a, 2303b, 2303c, 2303d, 2303e, and 2303f, such that those blocks become input blocks 2303a, 2303b, 2303c, 2303d, 2303e, and 2303f.

In one embodiment, neuron output blocks 2302a, 2302b, and 2302c each comprises analog-to-digital conversion block 2352 that output digital bits instead of analog signals. Those digital bits are then routed to the desired location using configurable interconnects of FIG. 23. In this embodiment, activation circuit blocks 2303a, 2303b, 2303c, 2303d, 2303e, and 2303f each comprises digital-to-analog conversion block 2351 that receives digital bits from the interconnects of FIG. 23 and converts the digital bits into analog signals.

In instances where configurable system 2300 is used to implement an LSTM or GRU, output blocks 2302a, 2302b, 2302c, 2302d, 2302e, and 2302f and/or input blocks 2303a, 2303b, 2303c, 2303d, 2303e, and 2303f may include multiplier block, addition block, subtraction (output=1−input) block as needed for LSTM/GRU architecture, and optionally may include analog sample-and-hold circuits (such as circuits 3600 or 3650 in FIG. 36) or digital sample-and-hold circuits (e.g., a register or SRAM) as needed.

Configurable flash analog neuro memory system 2300 also comprises controller or control logic 2250. As in FIG. 21, controller or control logic 2250 optionally is a microcontroller running software code to perform the configurations described herein (controller), or hardware logic for performing the configurations described herein (control logic), including activation of horizontal multiplexors 2304a, 2304b, 2304c, and 2304d; vertical multiplexors 2305a, 2305b, 2305c, 2305d, 2305e, and 2305f; and cross multiplexors 2306a and 2306b to perform the needed routing functions at each cycle.

Figure 24:
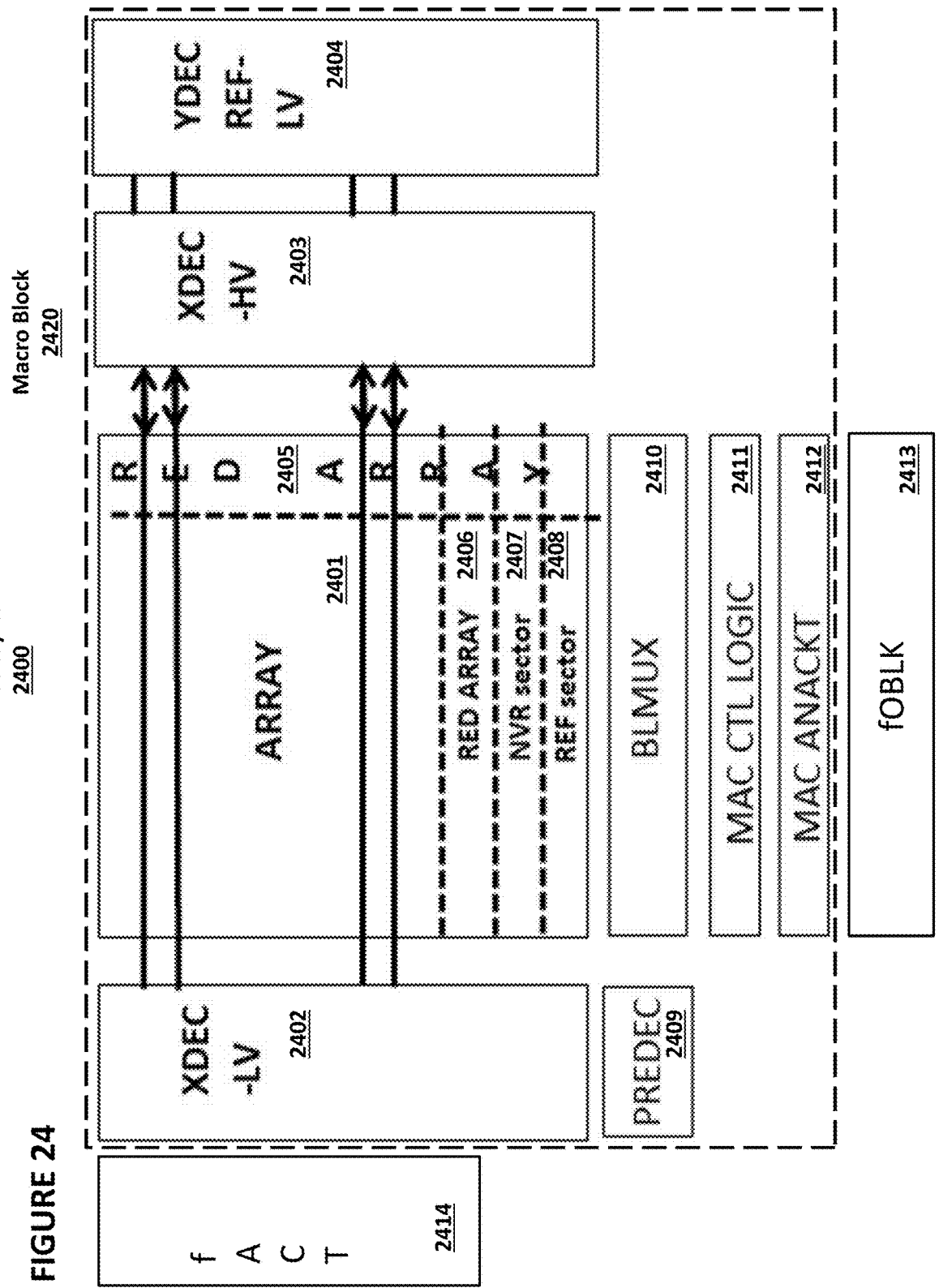
FIG. 24 depicts a vector-by-matrix multiplication (VMM) sub-system within the configurable flash analog neuro memory systems of FIG. 22 or 23.

FIG. 24 depicts VMM system 2400. VMM system 2400 comprises macro block 2420 (which can be used to implement macro blocks 2201a, 2201b, 2201c, 2201d, 2201e, 2201*f*, 2301*a*, 2301*b*, 2301*c*, 2301*d*, 2301*e*, and 2301*f* in FIGS. 22 and 23) and activation function block 2414 and summer block 2413.

VMM system 2400 comprises VMM array 2401, low voltage row decoder 2402, high voltage row decoder 2403, and low voltage reference column decoder 2404. Low voltage row decoder 2402 provides a bias voltage for read and program operations and provides a decoding signal for high voltage row decoder 2403. High voltage row decoder 2403 provides a high voltage bias signal for program and erase operations.

VMM system 2400 further comprises redundancy arrays 2405 and 2406. Redundancy arrays 2405 and 2406 provides array redundancy for replacing a defective portion in array 2401. VMM system 2400 further comprises NVR (non-volatile register, aka info sector) sector 2407, which are array sectors used to store user info, device ID, password, security key, trimbits, configuration bits, manufacturing info, etc. VMM system 2400 further comprises reference sector 2408 for providing reference cells to be used in a sense operation; predecoder 2409 for decoding addresses for decoders 240, 2403, and/or 2404; bit line multiplexor 2410; macro control logic 2411; and macro analog circuit block 2412, each of which performs functions at the VMM array level (as opposed to the system level comprising all VMM arrays).

Figure 25:
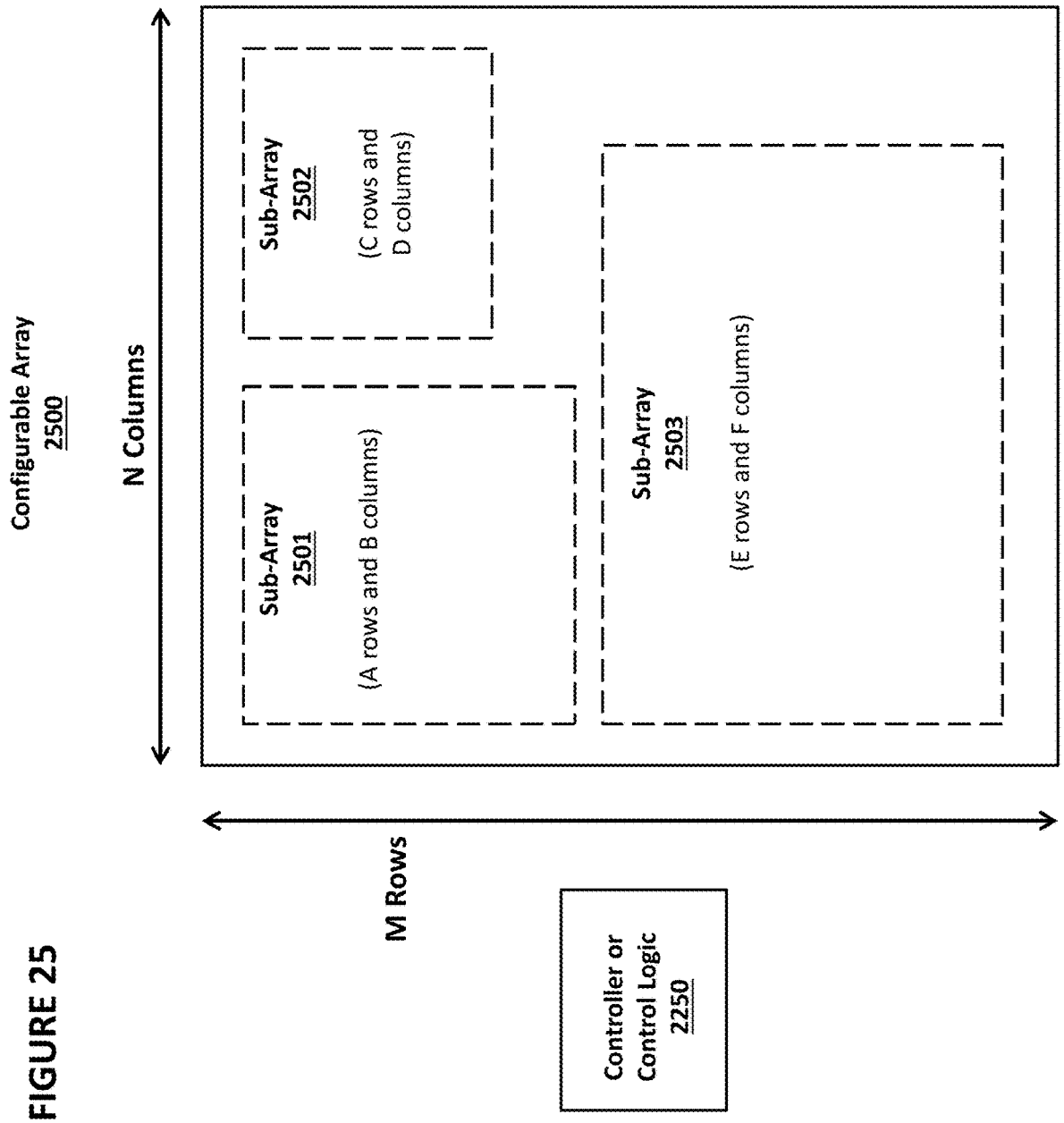
FIG. 25 depicts a configurable VMM array within the VMM sub-system of FIG. 24.

FIG. 25 depicts examples of array configurability, which can be used in the embodiments of FIGS. 22-24. Configurable array 2500 comprises an array of M rows by N columns. Configurable array 2500 can be a flash memory cell array containing cells of the types shown in FIGS. 2-5. In the embodiments of FIGS. 22-24, each VMM array can be configured into one or more sub-arrays of different sizes that are smaller than configurable array 2500. For instance, configurable array can be divided into sub-array 2501 of A rows by B columns, sub-array 2502 of C rows by D columns, and sub-array 2503 of E rows by F columns. This configuration can be implemented by controller or control logic 2250. Once each of the desired sub-arrays is created, controller or control logic 2250 can configure the horizontal, vertical, and cross multiplexors of FIGS. 22 and 23 to perform the appropriate routing from each sub-array to the appropriate location at the appropriate time. Ideally, only one sub-array in each configurable array will be accessed during any given cycle at time t (for example, through array time multiplexing). For example, only one of the sub-arrays in configurable array 2500 will be accessed during a single cycle. However, the sub-arrays can be accessed during different time cycles, which allows the same physical array to provide multiple sub-arrays for use in a time-multiplexed fashion.

Examples of embodiments of the circuit blocks shown in FIGS. 22-24 will now be described.

Figure 26:
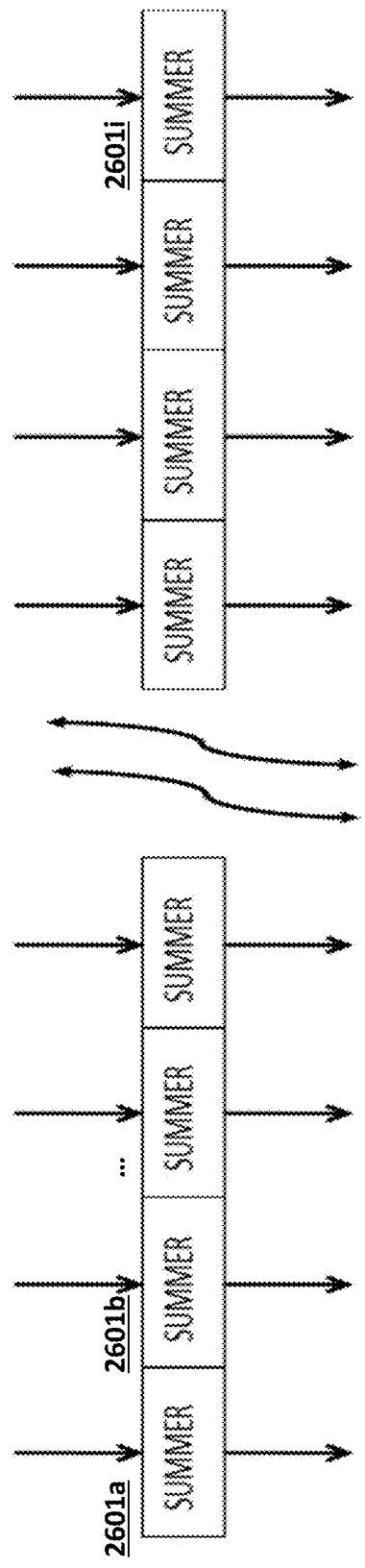
FIG. 26 depicts a configurable summer block within the VMM sub-system of FIG. 24.

FIG. 26 depicts neuron output summer block 2600 (which can be used as neuron output summer blocks 2202*a*, 2202*b*, 2202*c*, 2202*d*, 2202*e*, and 2201*f* in FIG. 22; neuron output summer blocks 2302, 2302*b*, 2302*c*, 2302*d*, 2302*e*, and 2302*f* in FIG. 23; and neuron output summer block 2413 in FIG. 24. It can be seen that neuron output summer block 2600 comprises a plurality of smaller summer blocks 2601*a*, 2601*b*, . . . 2601*i*, each of which can operate on a portion of a corresponding VMM array (such as a single column in the array). Controller or control logic 2250 can activate the appropriate summer blocks 2601*a*, 2601*b*, . . . 2601*i* during each cycle as needed. The summer circuit can be implemented as an op amp based summer circuit or a current mirror circuit. The summer circuit may include an ADC circuit to convert analog into output digital bits.

Figure 27:
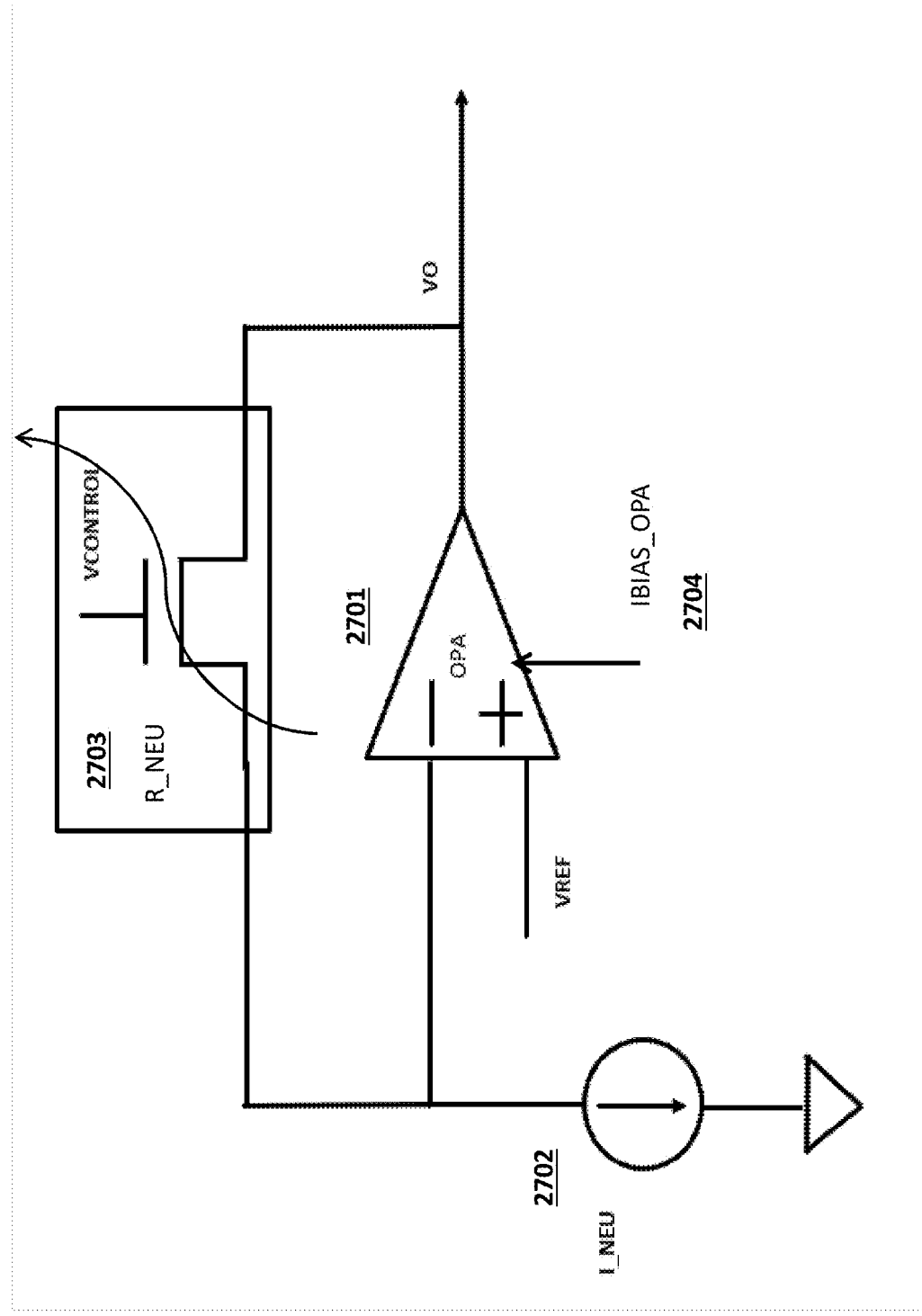
FIG. 27 depicts an adaptable neuron for use in the configurable flash analog neuro memory systems of FIG. 22 or 23.

FIG. 27 depicts adaptable neuron circuit 2700 that comprises on an op amp that provides low impedance output, for summing multiple current signals and converting the summed current signal into a voltage signal, and which is an embodiment of each summer block within summer block 2601*a*, . . . , 2601*i* in FIG. 26. Adaptable neuron circuit 2700 receives current from a VMM, such as VMM array 2401 (labeled I_NEU), which here is represented as current source 2702, which is provided to the inverting input of operational amplifier 2701. The non-inverting input of operational amplifier 2701 is coupled to a voltage source (labeled VREF). The output (labeled VO) of operational amplifier 2701 is coupled to NMOS R_NEU transistor 2703, which acts as a variable resistor of effective resistance R_NEU in response to the signal VCONTROL, which is applied to the gate of NMOS transistor 2703. The output voltage, Vo, is equal to I_NEU*R_NEU−VREF. The maximum value of I_NEU depends on the number of synapses and weight value contained in the VMM. R_NEU is a variable resistance and can be adapted to the VMM size it is coupled to. For instance, R_NEU, can be altered by changing IBIAS and/or VDREF and/or VREF in FIG. 27. Further, the power of the summing operational amplifier 2701 is adjusted in relation the value of the R_NEU transistor 2703 to minimize power consumption. As the value of R_NEU transistor 2703 increases, the bias (i.e., power) of the operational amplifier 2701 is reduced via current bias IBIAS_OPA 2704 and vice versa. Since the op amp based summer circuit can provide low impedance output, it is suitable to be configured to drive a long interconnect and heavier loading.

Figure 28:
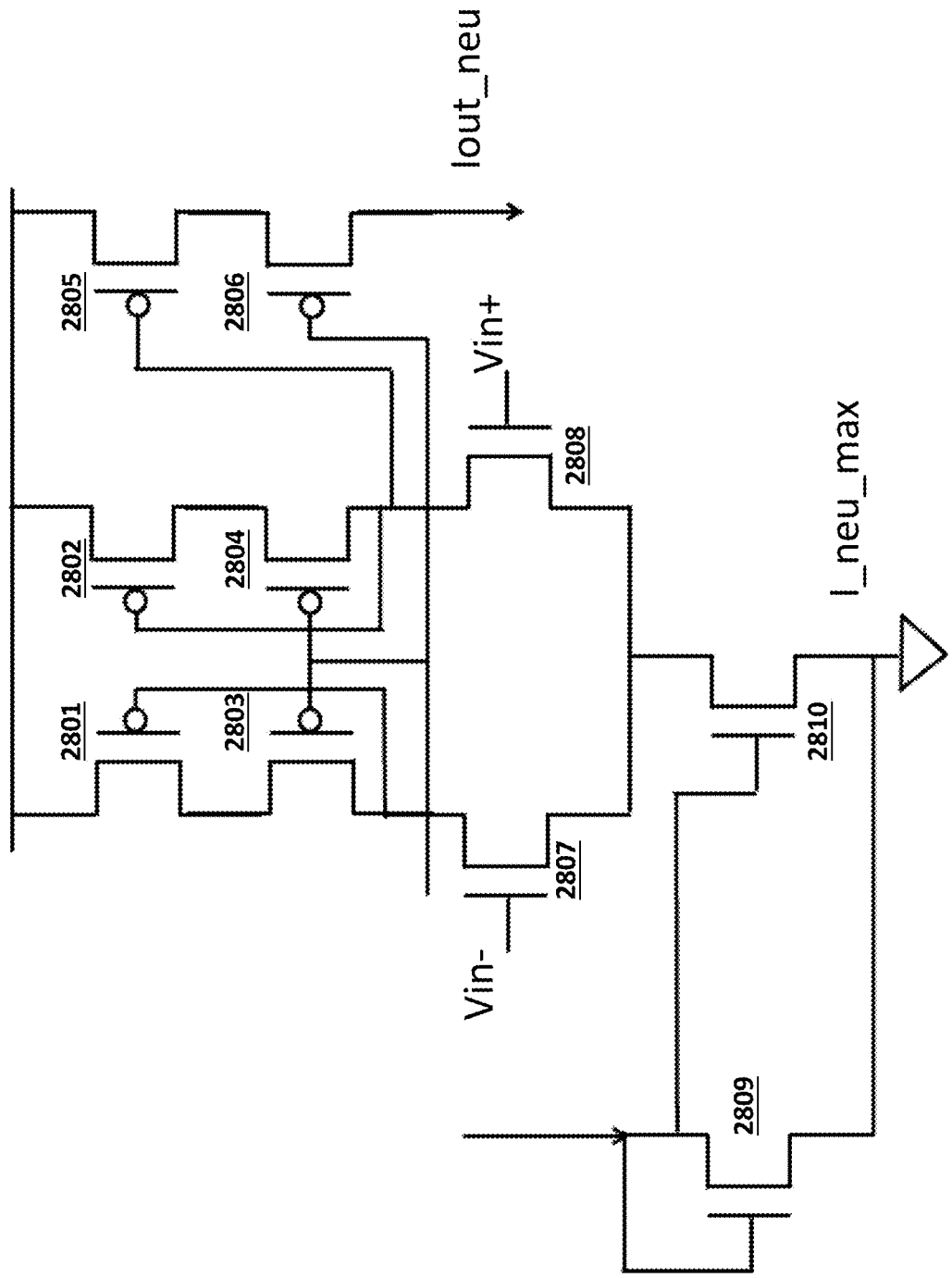
FIG. 28 depicts an activation function circuit for use in the configurable flash analog neuro memory systems of FIG. 22 or 23.

FIG. 28 depicts activation function circuit 2800. Activation function circuit 2800 can be used for activation circuit blocks 2203*a*, 2203*b*, 2203*c*, 2203*d*, 2203*e*, and 2203*f* in FIG. 22 and activation circuit blocks 2303*a*, 2303*b*, 2303*c*, 2303*d*, 2303*e*, and 2303*f* in FIG. 23, and activation block 2414 in FIG. 24.

Activation function circuit 2800 converts an input voltage pair (Vin+ and Vin−) into a current (Iout_neu) using a tan h function, and which can be used with the VMM arrays described above. Activation function circuit 2800 comprises PMOS transistors 2801, 2802, 2803, 2804, 2805, and 2806 and NMOS transistors 2807, 2808, 2809, and 2810, configured as shown. The transistors 2803, 2804, and 2806 serve as cascoding transistors. The input NMOS pair 2807 and 2808 operates in sub-threshold region to realize the tan h function. The current I_neu_max is the maximum neuron current that can be received from the attached VMM (not shown).

Figure 29:
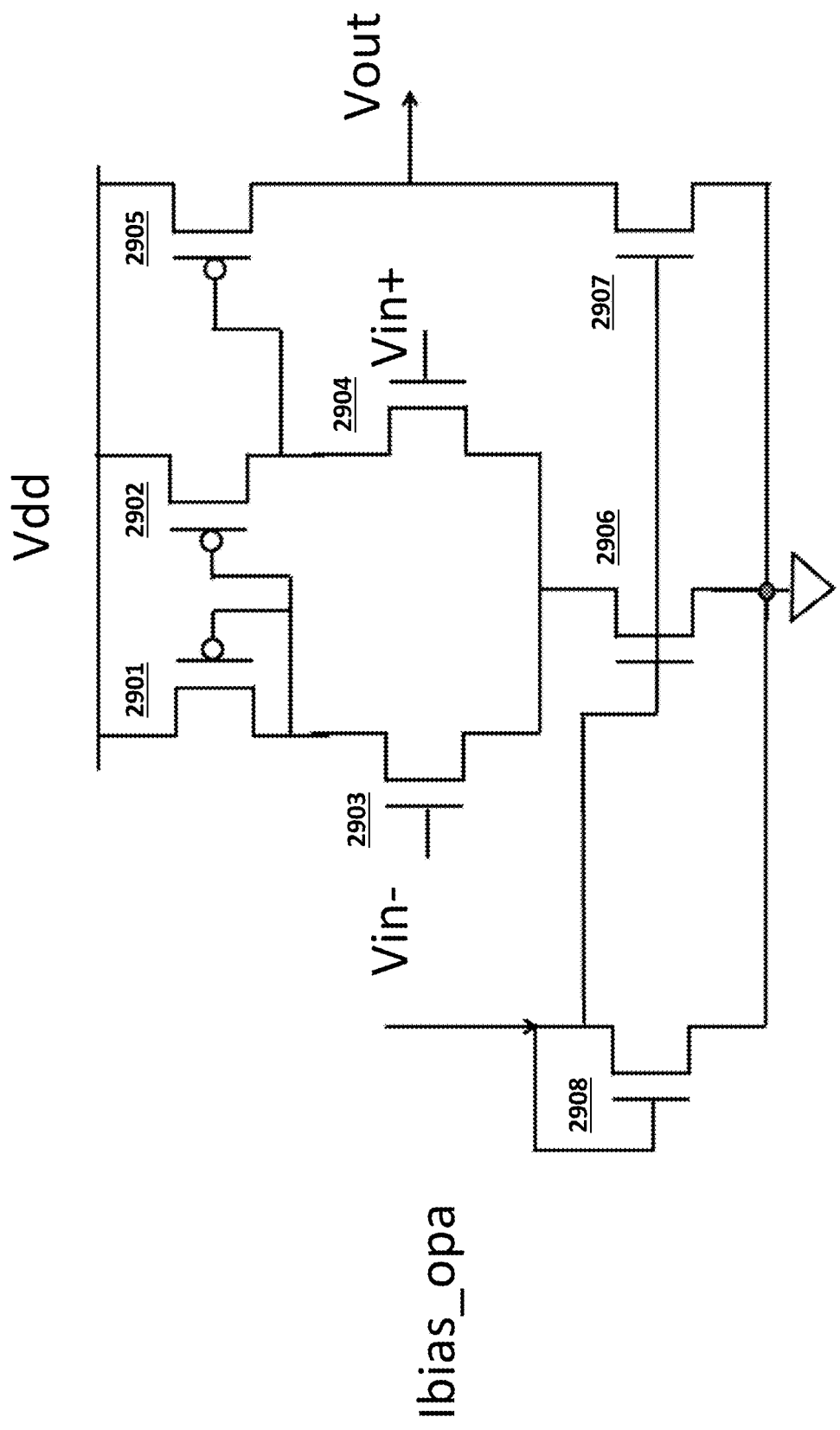
FIG. 29 depicts an operation amplifier for use in the adaptable neuron of FIG. 27.

FIG. 29 depicts operational amplifier 2900 that can be used as operational amplifier 2701 in FIG. 27. Operational amplifier 2900 comprises PMOS transistors 2901, 2902, and 2905, NMOS transistors 2903, 2904, 2906, and 2907, and NMOS transistor 2908 that acts as a variable bias, in the configuration shown. The input terminals to operational amplifier 2900 are labeled Vinn (applied to the gate of NMOS transistor 2904) and Vin− (applied to the gate of NMOS transistor 2903), and the output is VO.

Figure 30:
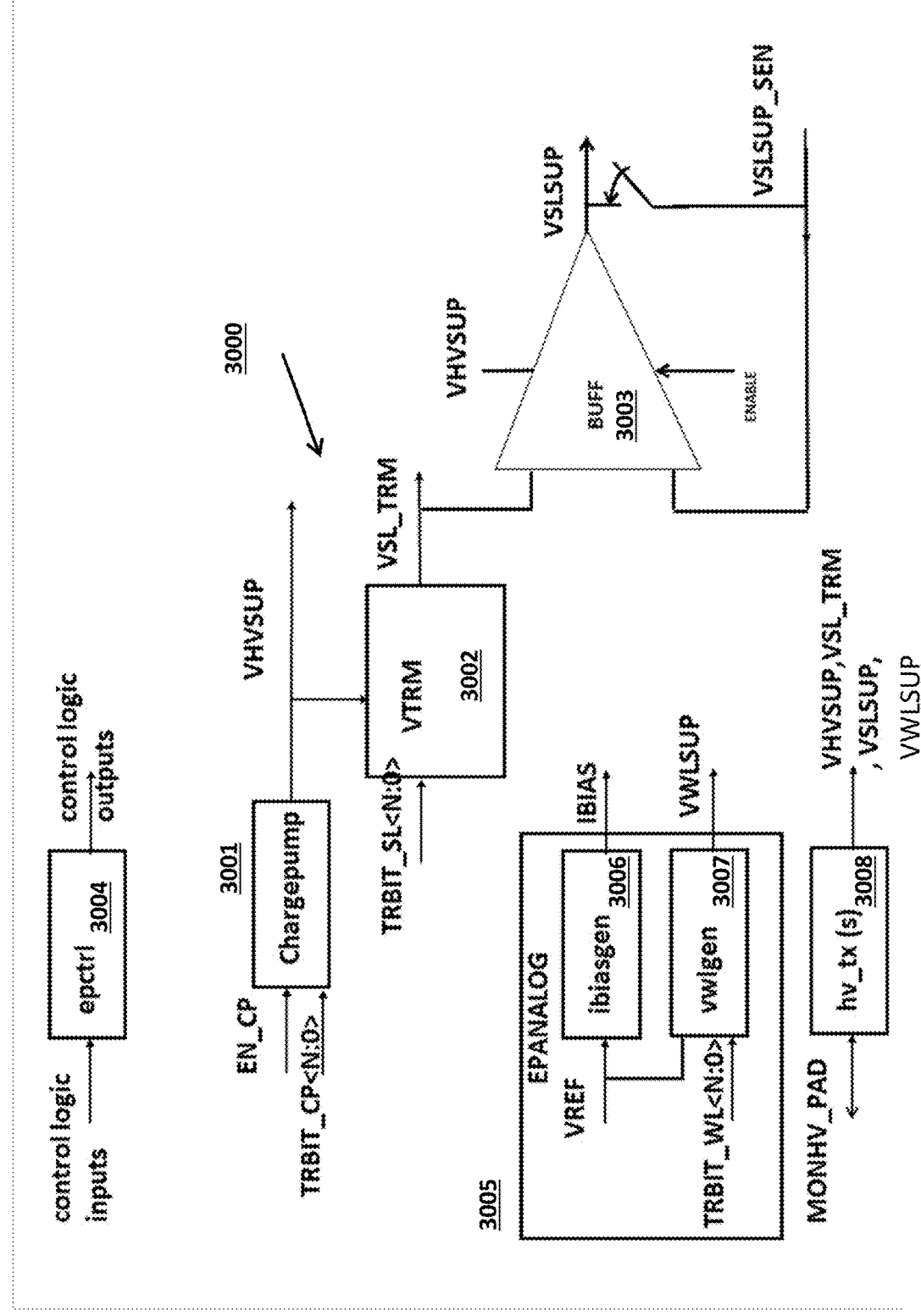
FIG. 30 depicts various blocks used in conjunction with vector-by-matrix multiplication arrays for use in the configurable flash analog neuro memory systems of FIG. 22 or 23.

FIG. 30 depicts high voltage generation block 3000, control logic block 3004, analog circuit block 3005, and test block 3008.

High voltage generation block 3000 comprises charge pump 3001, charge pump regulator 3002, and high voltage operational amplifier 3003. The voltage of the output of charge pump regulator 3002 can be controlled based on the signals sent to the gates of the NMOS transistors in charge pump regulator 3002. Control logic block 3004 receives control logic inputs and generates control logic outputs. Analog circuit block 3005 comprises current bias generator 3006 for receiving a reference voltage, Vref, and generating a current that can be used to apply a bias signal, iBias, as used elsewhere. Analog circuit block 3005 also comprises voltage generator 3007 for receiving a set of trim bits, TRBIT_WL, and generating a voltage to apply to word lines during various operations. Test block 3008 receives signals on a test pad, MONHV_PAD, and outputs various signals for a designer to monitor during testing.

Figure 31:
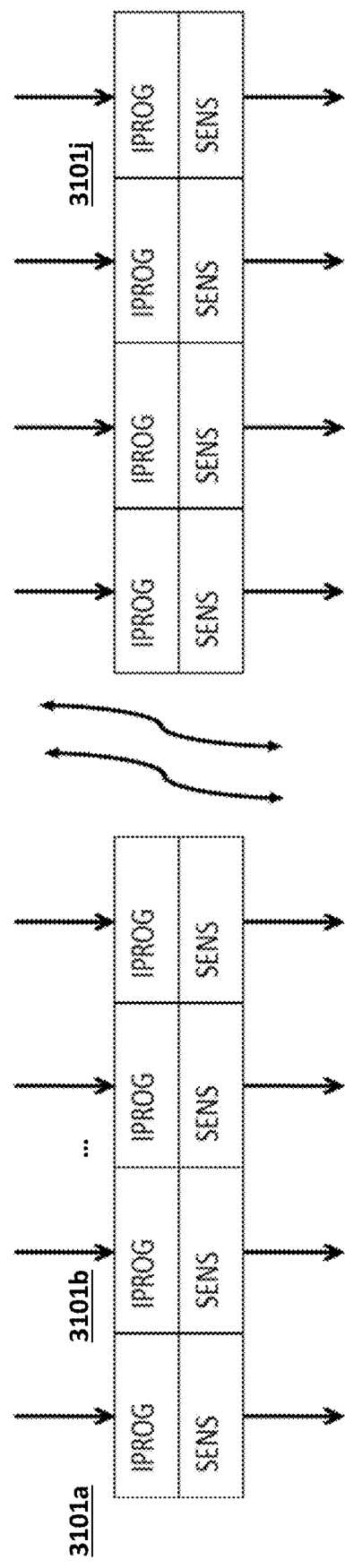
FIG. 31 depicts a program and sense block for use in the configurable flash analog neuro memory systems of FIG. 22 or 23.

FIG. 31 depicts program and sensing block 3100, which can be used during program and verify operations. Program and sensing block 3100 comprises a plurality of individual program and sense circuit blocks 3101*a*, 3101*b*, . . . 3101*j*. Controller or control logic 2250 can activate the appropriate program and sense circuit blocks 3101*a*, 3101*b*, . . . 3101*j* during each cycle as needed.

Figure 32:
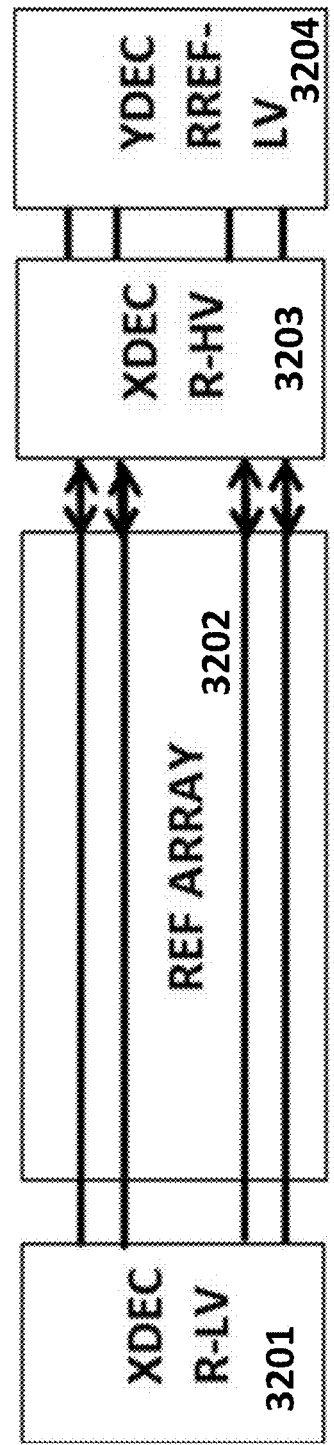
FIG. 32 depicts a reference array system for use in the configurable flash analog neuro memory systems of FIG. 22 or 23.

FIG. 32 depicts reference system 3200, which can be used in place of reference sector 2408 in FIG. 24. Reference system 3200 comprises reference array 3202, low voltage row decoder 3201, high voltage row decoder 3203, and low voltage reference column decoder 3204. Low voltage row decoder 3201 provides a bias voltage for read and program operations and provides a decoding signal for high voltage row decoder 3203. High voltage row decoder 3203 provides a high voltage bias signal for program and erase operations.

Figure 33:
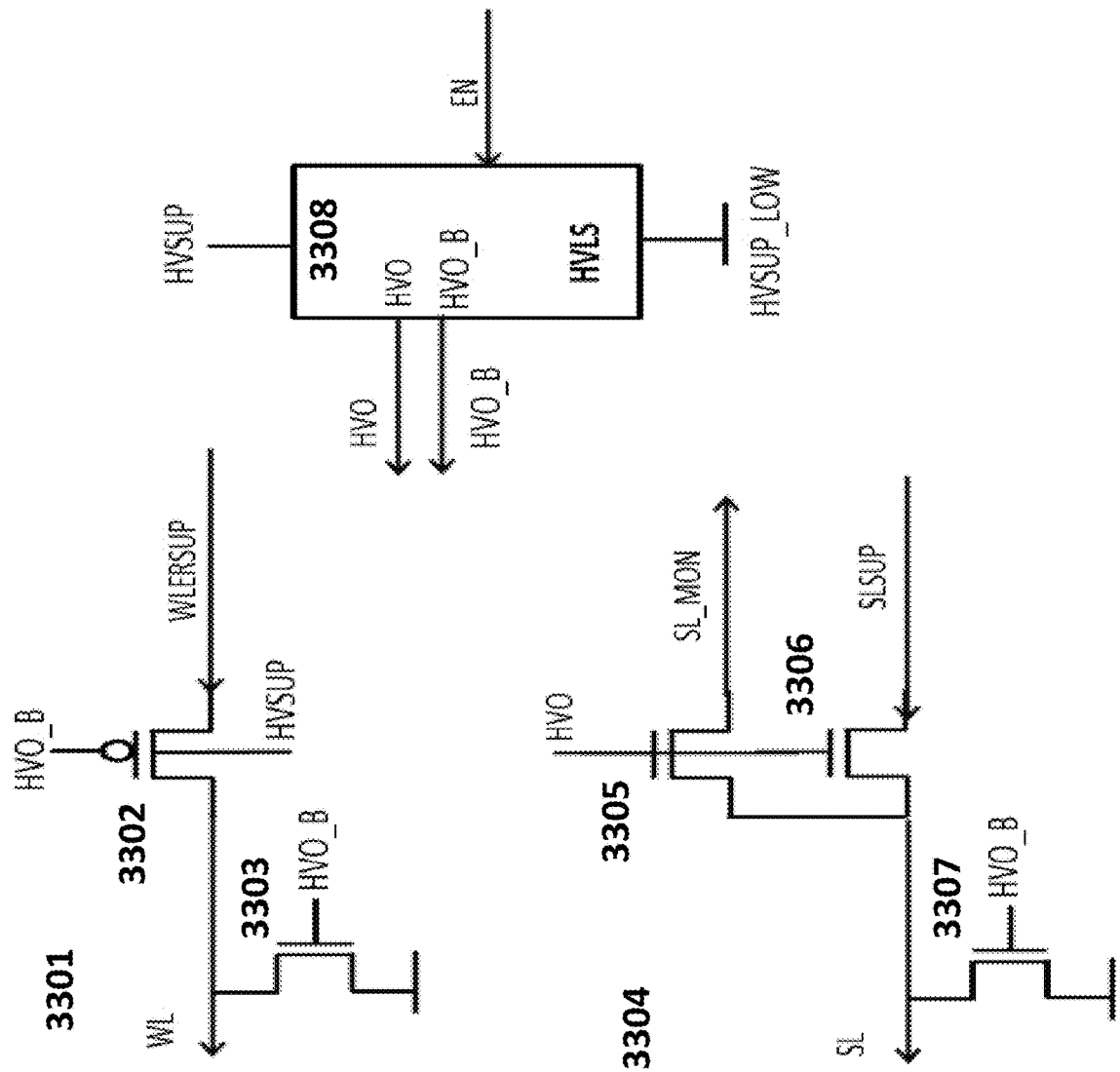
FIG. 33 depicts decoding circuitry for use in the configurable flash analog neuro memory systems of FIG. 22 or 23.

FIG. 33 depicts VMM high voltage decode circuits, comprising word line decoder circuit 3301, source line decoder circuit 3304, and high voltage level shifter 3308, which are appropriate for use with memory cells of the type shown in FIG. 2.

Word line decoder circuit 3301 comprises PMOS select transistor 3302 (controlled by signal HVO_B) and NMOS de-select transistor 3303 (controlled by signal HVO_B) configured as shown.

Source line decoder circuit 3304 comprises NMOS monitor transistors 3305 (controlled by signal HVO), driving transistor 3306 (controlled by signal HVO), and de-select transistor 3307 (controlled by signal HVO_B), configured as shown.

High voltage level shifter 3308 received enable signal EN and outputs high voltage signal HV and its complement HVO_B.

Figure 34:
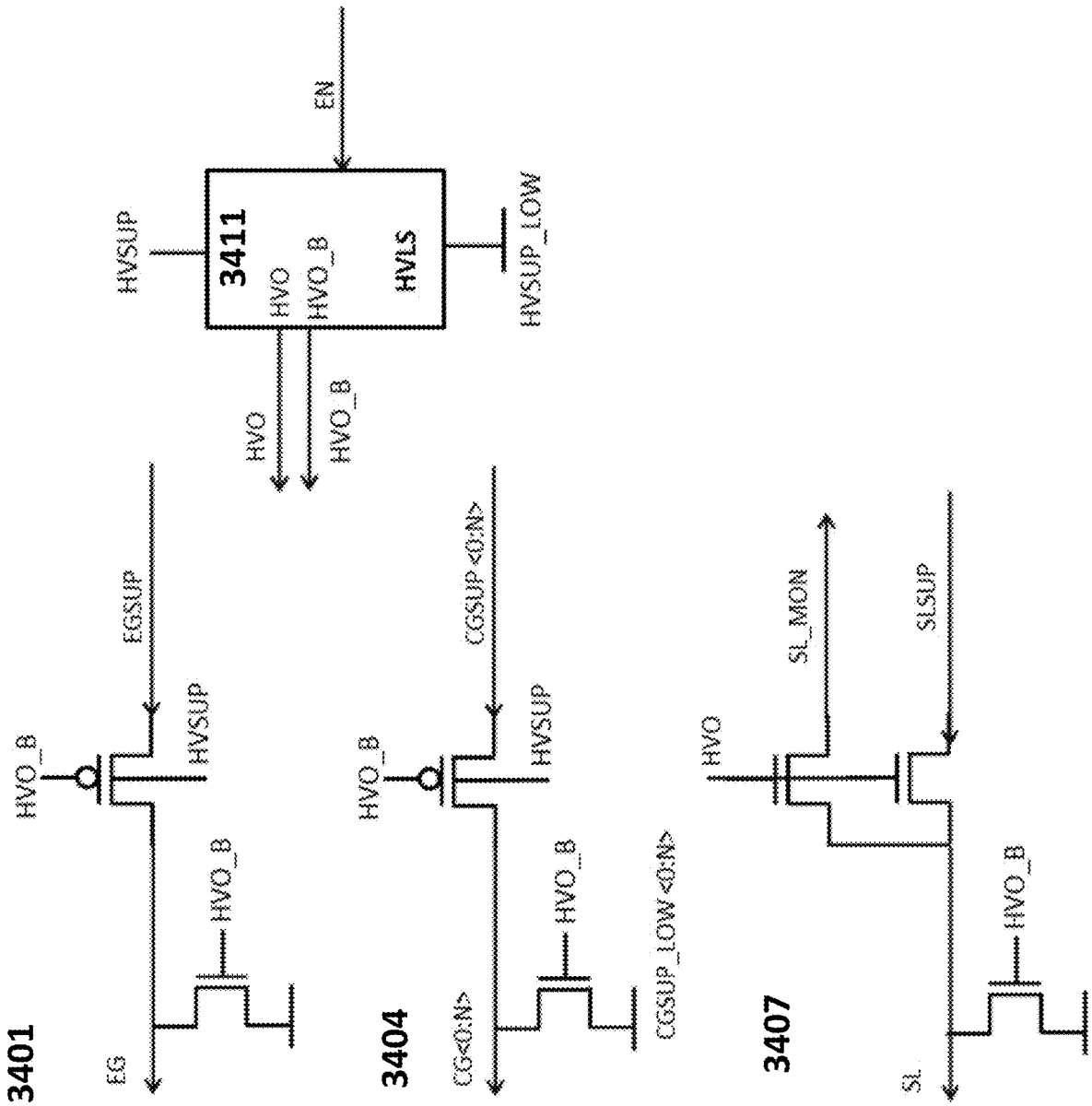
FIG. 34 depicts decoding circuitry for use in the configurable flash analog neuro memory systems of FIG. 22 or 23

FIG. 34 depicts VMM high voltage decode circuits, comprising erase gate decoder circuit 3401, control gate decoder circuit 3404, source line decoder circuit 3407, and high voltage level shifter 3411, which are appropriate for use with memory cells of the type shown in FIG. 3.

Erase gate decoder circuit 3401 and control gate decoder circuit 3404 use the same design as word line decoder circuit 3301 in FIG. 33.

Source line decoder circuit 3407 uses the same design as source line decoder circuit 3304 in FIG. 33.

High voltage level shifter 3411 uses the same design as high voltage level shifter 3308 in FIG. 33.

Figure 35:
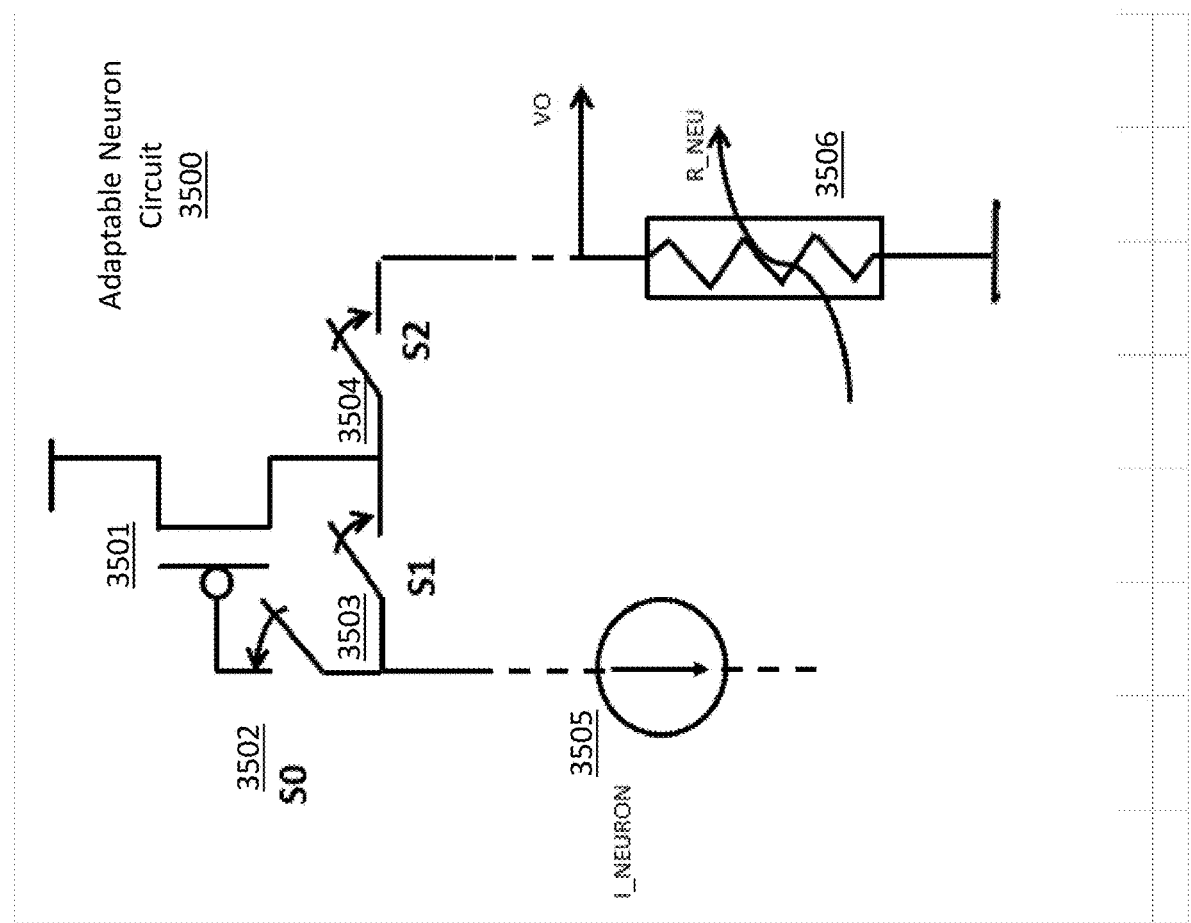
FIG. 35 depicts an adaptable output neuron circuit.

FIG. 35 depicts adaptable neuron circuit 3500 that converts an output neuron current into a voltage. Adaptable neuron circuit 3500 uses only one PMOS transistor 3501 and essentially is configured to mirror itself (i.e., a sample and hold mirror) using switches 3502, 3503, and 3504. Initially, switch 3502 and switch 3503 are closed and switch 3504 is open, at which time PMOS transistor 3501 is coupled to I_NEURON, which is a current source that represents the current from a VMM. Then, switch 3502 and 3503 are opened and switch 3504 is closed, which causes PMOS transistor 3501 to send current I_NEURON from its drain to variable resistor 3506. Thus, adaptable neuron 3500 converts a current signal (I_NEURON) into a voltage signal (VO). Basically, transistor 3501 samples the current I_NEURON and holds it by storing a sampled gate-source voltage on its gate. An op amp circuit can be used to buffer the output voltage VO to drive the configurable interconnect.

Figure 36:
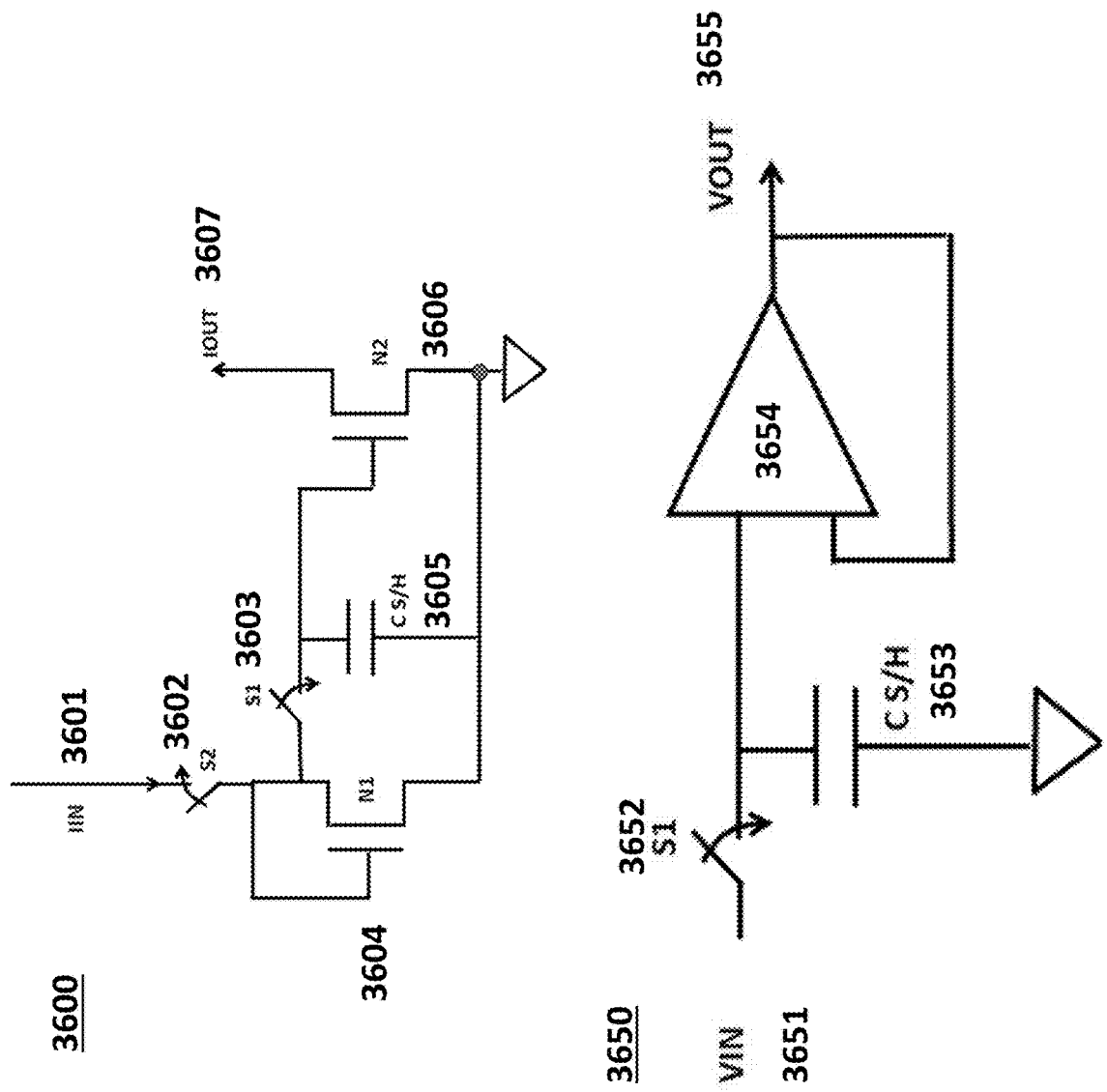
FIG. 36 depicts sample and hold circuits.

FIG. 36 depicts current sample and hold S/H circuit 3600 and voltage sample and hold S/H circuit 3650. Current S/H circuit 3600 includes sampling switches 3602 and 3603, S/H capacitor 3605, input transistor 3604 and output transistor 3606. Input transistor 3604 is used to convert input current 3601 into an S/H voltage on the S/H capacitor 3605 and is coupled to gate of the output transistor 3606. Voltage S/H circuit 3650 includes sampling switch 3622, S/H capacitor 3653, and op amp 3654. Op amp 3654 is used to buffer the S/H voltage on the capacitor 3653. S/H circuits 3600 and 3650 can be used with the output summer circuits and/or activation circuits described herein. In an alternative embodiment, digital sample and hold circuits can be used instead of analog sample and hold circuits 3600 and 3650.

Figure 37:
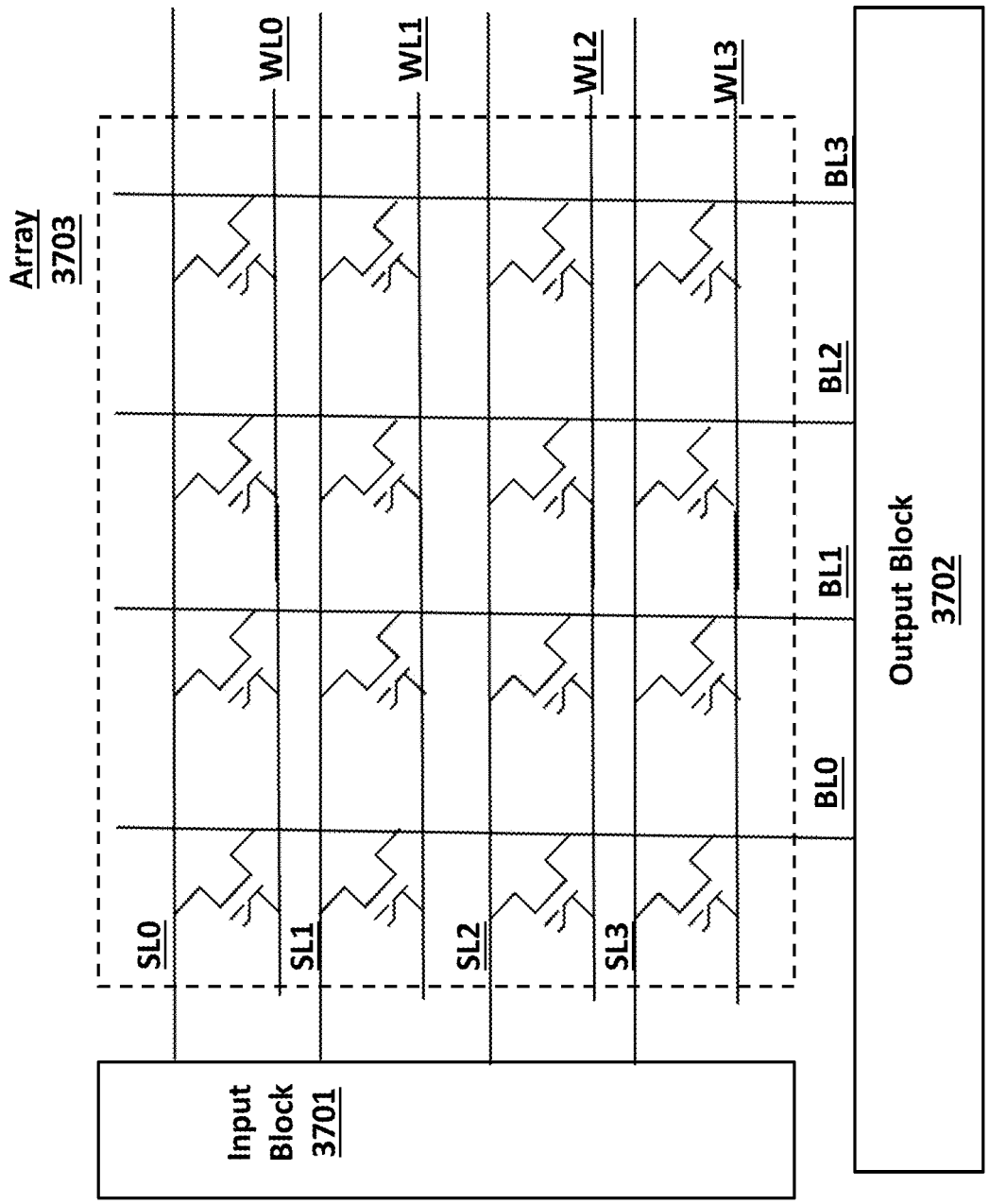
FIG. 37 depicts an array architecture that is suitable for memory cells operating in the linear region.

FIG. 37 shows an array architecture that is suitable for memory cells operating in linear region. System 3700 comprises input block 3701, output block 3702, and array 3703 of memory cells. Input block 3701 is coupled to the drains (source lines) of the memory cells in array 3703, and output block 3702 is coupled to the bit lines of the memory cells in array 3703. Alternatively, input block 3701 is coupled to the wordlines of the memory cells in array 3703, and output block 3702 is coupled to the bit lines of the memory cells in array 3703.

In instances where system 3700 is used to implement an LSTM or GRU, output block 3702 and/or input block 3701 may include multiplier block, addition block, subtraction (output=1−input) block as needed for LSTM/GRU architecture, and optionally may include analog sample-and-hold circuits (such as circuits 3600 or 3650 in FIG. 36) or digital sample-and-hold circuits (e.g., a register or SRAM) as needed.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A configurable vector-by-matrix multiplication system, comprising:
    an array of memory cells arranged into rows and columns;
    an output block coupled to the array for generating a vector of output voltages in response to current received from a plurality of memory cells in the array during a vector matrix multiplier operation;

an activation block coupled to the array for generating a vector of input currents in response to a vector of input voltages and providing the vector of input currents to a plurality of memory cells in the array during a vector matrix multiplier operation, wherein during a first cycle, a first sub-array is generated in the array and the output block is coupled to the first sub-array and the activation block is coupled to the first sub-array, and wherein during a second cycle, a second sub-array is generated within the array and the output block is coupled to the second sub-array and the activation block is coupled to the second sub-array, the first sub-array and second sub-array consisting of different memory cells in the array; and routing circuitry for routing a vector of output voltages from the output block in response to current received from the first sub-array to the activation block for vector matrix multiplier operation of the second sub-array.

2. The system of claim 1, wherein the routing circuitry comprises one or more multiplexors.

3. The system of claim 1, further comprising a controller for generating the first sub-array and the second sub-array.

4. The system of claim 1, further comprising control logic for generating the first sub-array and the second sub-array.

5. The system of claim 1, wherein the memory cells are split-gate flash memory cells.

6. The system of claim 1, wherein the output block is a current summer block.

7. The system of claim 1, wherein the system provides a capability of configuring an output width of a neuron within the system.

8. The system of claim 1, wherein the system provides a capability of configuring an input width of a neuron within the system.

9. The system of claim 1, wherein the output block outputs digital bits.

10. The system of claim 1, further comprising one or more of a current sample-and-hold circuit or a voltage sample-and-hold circuit.

11. The system of claim 1, wherein the vector-by-matrix multiplication system is part of a long short term memory cell.

12. The system of claim 1, wherein the vector-by-matrix multiplication system is part of a gated recurrent unit cell.

13. A configurable vector-by-matrix multiplication system, comprising:

an array of memory cells arranged into rows and columns;

an output block coupled to the array for generating a vector of outputs in response to current received from a plurality of memory cells in the array during a vector matrix multiplier operation, wherein during a first cycle, a first sub-array is generated in the array and the output block is coupled to the first sub-array and the activation block is coupled to the first sub-array, and wherein during a second cycle, a second sub-array is generated within the array and the output block is coupled to the second sub-array and the activation block is coupled to the second sub-array, the first sub-array and second sub-array consisting of different memory cells in the array; and routing circuitry for routing a vector of output voltages from the output block in response to current received from the first sub-array to the activation block for vector matrix multiplier operation of the second sub-array.

14. The system of claim 13, wherein the routing circuitry comprises one or more multiplexors.

15. The system of claim 13, further comprising a controller for generating the first sub-array and the second sub-array.

16. The system of claim 13, further comprising control logic for generating the first sub-array and the second sub-array.

17. The system of claim 13, wherein the memory cells are split-gate flash memory cells.

18. The system of claim 13, wherein the output block is a current summer block.

19. The system of claim 13, wherein the system provides a capability of configuring an output width of a neuron within the system.

20. The system of claim 13, wherein the system provides a capability of configuring an input width of a neuron within the system.

21. The system of claim 13, wherein the output block outputs digital bits.

22. The system of claim 13, wherein the output block outputs analog levels.

23. The system of claim 13, further comprising one or more of a current sample-and-hold circuit and a voltage sample-and-hold circuit.

24. The system of claim 13, wherein the output block comprises an analog-to-digital conversion block.

25. The system of claim 13, further comprising an input block.

26. The system of claim 25, wherein the input block comprises an activation block.

27. The system of claim 25, wherein the input block comprises a digital-to-analog conversion block.

28. The system of claim 13, wherein the vector-by-matrix multiplication system is part of a long short term memory cell.

29. The system of claim 13, wherein the vector-by-matrix multiplication system is part of a gated recurrent unit cell.

30. The system of claim 13, wherein a weight is stored in a differential cell.

31. The system of claim 13, wherein a weight is stored in two blend memory cells.

32. A configurable vector-by-matrix multiplication system, comprising:

an array of memory cells arranged into rows and columns;

an input block coupled to the array for generating a vector of inputs in response to input data to a plurality of memory cells in the array during a vector matrix multiplier operation, wherein during a first cycle, a first sub-array is generated in the array and the input block is coupled to the first sub-array, and wherein during a second cycle, a second sub-array is generated within the array and the input block is coupled to the second sub-array, the first sub-array and second sub-array consisting of different memory cells in the array; and routing circuitry for routing a vector of input vector from the input block in response to input data coupled to the first sub-array for vector matrix multiplier operation.

33. The system of claim 32, wherein the routing circuitry comprises one or more multiplexors.

34. The system of claim 32, further comprising a controller for generating the first sub-array and the second sub-array.

35. The system of claim 32, further comprising control logic for generating the first sub-array and the second sub-array.

36. The system of claim 32, wherein the memory cells are split-gate flash memory cells.

37. The system of claim 32, further comprising an output block generating an output vector.

38. The system of claim 37, wherein the output block is a current summer block.

39. The system of claim 32, wherein the system provides a capability of configuring an output width of a neuron within the system.

40. The system of claim 32, wherein the system provides a capability of configuring an input width of a neuron within the system.

41. The system of claim 32, wherein the output block outputs digital bits.

42. The system of claim 32, wherein the output block outputs analog levels.

43. The system of claim 32, further comprising one or more of a current sample-and-hold circuit and a voltage sample-and-hold circuit.

44. The system of claim 32, wherein the output block comprises an analog-to-digital conversion block.

45. The system of claim 33, wherein the output block comprises an analog-to-digital conversion block.

46. The system of claim 32, wherein the input block comprises an activation block.

47. The system of claim 32, wherein the input block comprises a digital-to-analog conversion block.

48. The system of claim 32, wherein the input block is coupled to a source gate of each memory cell in the array of memory cells.

49. The system of claim 32, wherein the input block is coupled to a word line gate of each memory cell in the array of memory cells.

50. The system of claim 32, wherein the vector-by-matrix multiplication system is part of a long short term memory cell.

51. The system of claim 32, wherein the vector-by-matrix multiplication system is part of a gated recurrent unit cell.

52. The system of claim 32, wherein a weight is stored in a differential cell.

53. The system of claim 32, wherein a weight is stored in two blend memory cells.

54. An analog neuro memory system, comprising:
a plurality of vector-by-matrix multiplication sub-systems, each vector-by-matrix sub-system comprising:
an array of memory cells arranged into rows and columns;
an output block coupled to the array for generating a vector of output voltages in response to current received from a plurality of memory cells in the array during a vector matrix multiplier operation; and
an activation block coupled to the array for generating a vector of input currents in response to a vector of input voltages and providing the vector of input currents to a plurality of memory cells in the array during a vector matrix multiplier operation; and
routing circuitry for routing a vector of output voltages from an output block coupled to a first sub-array contained within a first array in one of the plurality of vector-by-matrix multiplication sub-systems to an activation block coupled to a second sub-array contained within a second array in another of the plurality of vector-by-matrix multiplication sub-systems.

55. The system of claim 54, wherein the routing circuitry comprises one or more multiplexors.

56. The system of claim 54, further comprising a controller for generating the first sub-array and the second sub-array.

57. The system of claim 54, further comprising control logic for generating the first sub-array and the second sub-array.

58. The system of claim 54, wherein some or all of the vector-by-matrix multiplication sub-systems form a long short term memory cell.

59. The system of claim 54, wherein some or all of the vector-by-matrix multiplication sub-systems form a gated recurrent unit cell.

60. The system of claim 54, wherein the memory cells are split-gate flash memory cells.

61. The system of claim 54, wherein the output block is a current summer block.

62. The system of claim 54, wherein the system provides a capability of configuring an output width of a neuron within the system.

63. The system of claim 54, wherein the system provides a capability of configuring an input width of a neuron within the system.

64. The system of claim 54, wherein the output block outputs digital bits.

65. The system of claim 54, further comprising current sample-and-hold circuits or voltage sample-and-hold circuits.

66. The system of claim 54, wherein the vector-by-matrix multiplication system is part of a long short term memory cell.

67. The system of claim 54, wherein the vector-by-matrix multiplication system is part of a gated recurrent unit cell.

* * * * *